(12) United States Patent
Jezewski et al.

(10) Patent No.: US 11,670,588 B2
(45) Date of Patent: Jun. 6, 2023

(54) SELECTABLE VIAS FOR BACK END OF LINE INTERCONNECTS

(71) Applicant: Intel Corporation, Santa Clara, CA (US)

(72) Inventors: Christopher Jezewski, Portland, OR (US); Ashish Agrawal, Hillsboro, OR (US); Kevin L. Lin, Beaverton, OR (US); Abhishek Sharma, Hillsboro, OR (US); Carl Naylor, Hillsboro, OR (US); Urusa Alaan, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 974 days.

(21) Appl. No.: 16/243,790

(22) Filed: Jan. 9, 2019

(65) Prior Publication Data

US 2020/0219804 A1   Jul. 9, 2020

(51) Int. Cl.
*H01L 23/528* (2006.01)
*H01L 23/522* (2006.01)
(Continued)

(52) U.S. Cl.
CPC ...... *H01L 23/528* (2013.01); *H01L 21/02568* (2013.01); *H01L 21/47635* (2013.01); *H01L 21/76802* (2013.01); *H01L 23/5226* (2013.01); *H01L 23/535* (2013.01); *H01L 27/124* (2013.01); *H01L 27/1222* (2013.01); *H01L 27/1259* (2013.01); *H01L 29/24* (2013.01); *H01L 29/41733* (2013.01); *H01L 29/42392* (2013.01); *H01L 29/66969* (2013.01); *H01L 29/78642* (2013.01); *G05B 2219/1163* (2013.01)

(58) Field of Classification Search
CPC ............... H01L 27/1222; H01L 27/124; H01L 27/1259; H01L 27/0688; H01L 29/24; H01L 29/41733; H01L 29/66969; H01L 29/78642; H01L 29/7799; H01L 21/02568; H01L 21/47635; H01L 21/76802; H01L 21/8221; H01L 21/823475; H01L 23/528; H01L 23/5226; H01L 23/535; H01L 23/525
See application file for complete search history.

(56) References Cited

U.S. PATENT DOCUMENTS 5,266,446 A * 11/1993 Chang ................... H01L 21/481
                                            438/692
8,441,042 B2   5/2013 Tyberg et al.
(Continued)

*Primary Examiner* — Galina G Yushina
(74) *Attorney, Agent, or Firm* — Schwabe, Williamson & Wyatt, P.C.

(57) ABSTRACT

Integrated circuits including selectable vias are disclosed. The techniques are particularly well-suited to back end of line (BEOL) processes. In accordance with some embodiments, a selectable via includes a vertically-oriented thin film transistor structure having a wrap around gate, which can be used to effectively select (or deselect) the selectable via ad hoc. When a selectable via is selected, a signal is allowed to pass through the selectable via. Conversely, when the selectable via is not selected, a signal is not allowed to pass through the selectable via. The selectable characteristic of the selectable via allows multiple vias to share a global interconnect. The global interconnect can be connected to any number of selectable vias, as well as standard vias.

13 Claims, 15 Drawing Sheets

(51) Int. Cl.
  *H01L 27/12*       (2006.01)
  *H01L 29/417*      (2006.01)
  *H01L 29/24*       (2006.01)
  *H01L 29/423*      (2006.01)
  *H01L 29/786*      (2006.01)
  *H01L 23/535*      (2006.01)
  *H01L 21/768*      (2006.01)
  *H01L 29/66*       (2006.01)
  *H01L 21/02*       (2006.01)
  *H01L 21/4763*     (2006.01)

(56) References Cited

U.S. PATENT DOCUMENTS

| | | | | |
|---|---|---|---|---|
| 2001/0019133 A1* | 9/2001 | Konuma | ............ | H01L 27/1248 257/40 |
| 2001/0032991 A1* | 10/2001 | Hofmann | .......... | H01L 27/10841 257/E21.654 |
| 2004/0198055 A1* | 10/2004 | Wang | ................ | H01L 21/76832 438/692 |
| 2005/0073051 A1* | 4/2005 | Yamamoto | .......... | H01L 27/0688 438/597 |
| 2006/0046391 A1* | 3/2006 | Tang | ................ | H01L 29/78642 438/269 |
| 2007/0172770 A1* | 7/2007 | Witters | .................. | H01L 27/11 430/311 |
| 2008/0308939 A1* | 12/2008 | Matsunaga | ....... | H01L 23/53238 257/E23.141 |
| 2009/0152611 A1* | 6/2009 | Fujimoto | .......... | H01L 21/76897 438/269 |
| 2012/0153495 A1* | 6/2012 | Mallik | .................. | H05K 3/427 257/774 |
| 2015/0200308 A1* | 7/2015 | Karda | ................ | H01L 27/2463 257/329 |
| 2016/0233270 A1* | 8/2016 | Takaki | ............... | H01L 27/2436 |
| 2017/0330790 A1* | 11/2017 | He | ..................... | H01L 23/5222 |

* cited by examiner

SELECTABLE VIAS FOR BACK END OF LINE INTERCONNECTS

BACKGROUND

Integrated circuits generally include transistors electrically connected or arranged to form functional circuits. Oftentimes a given large-scale integrated circuit can include millions and, in some instances, billions of transistors. Such integrated circuits can also include a similarly vast amount of interconnect lines, which essentially form metal routing wires that extend through one or more stacked interconnect layers. These wires, also known as interconnects, electrically connect the transistors and other features in the integrated circuit to one another to form functional circuits. Such interconnects typically involve the use of vias and lateral metal lines. There are a number of non-trivial issues associated with making large numbers of such interconnect lines, particularly as dimensions continue to scale downward.

Figure 1:
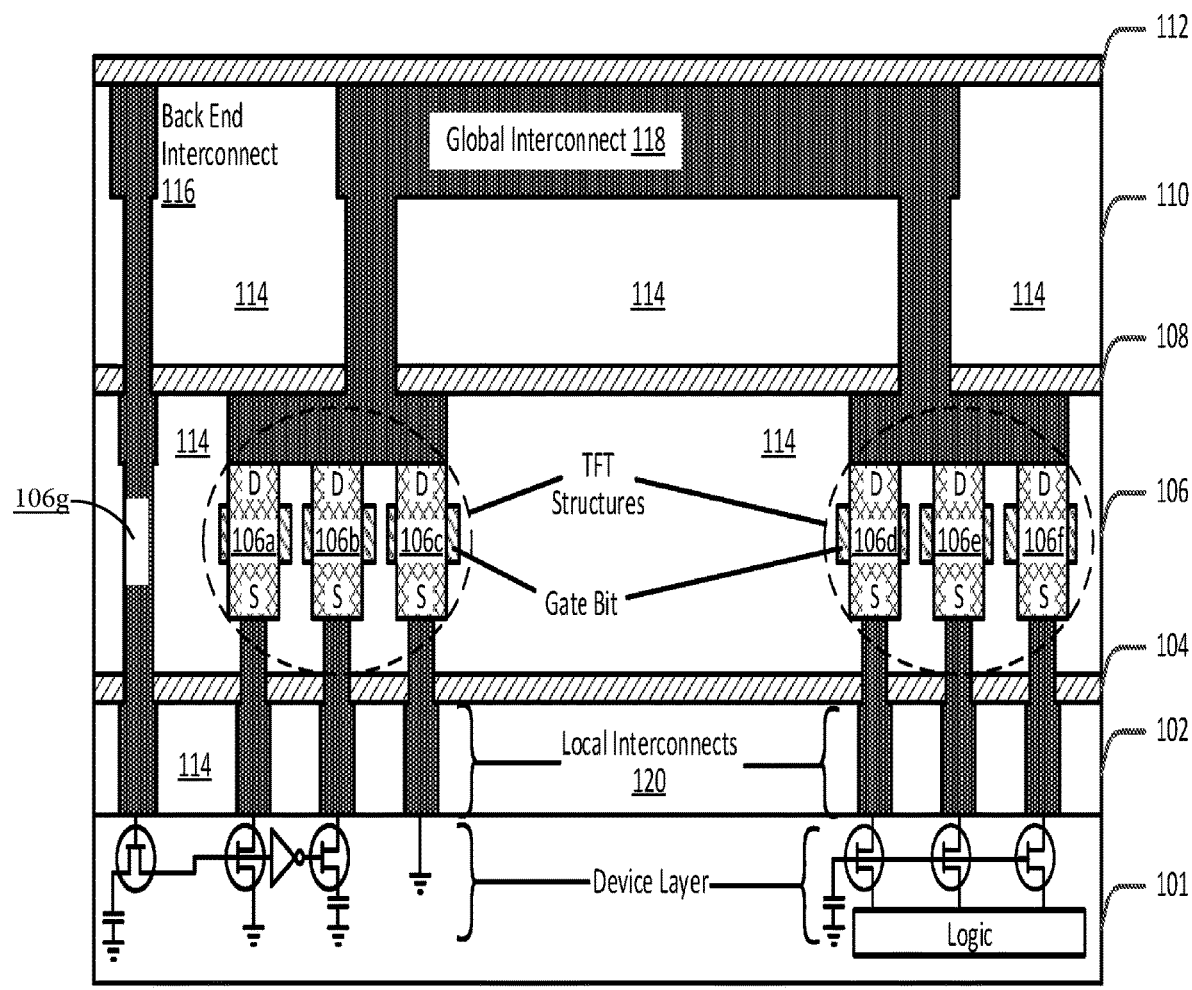
FIG. 1 illustrates an example integrated circuit structure including back end of line selectable vias arranged to provide a global interconnect, in accordance with an embodiment of the present disclosure.

These and other features of the present embodiments will be understood better by reading the following detailed description, taken together with the figures herein described.

DETAILED DESCRIPTION

Integrated circuits including interconnect-based selectable vias and methods for forming the same are disclosed. In an embodiment, a back end of line (BEOL) selectable via (sometimes referred to herein more simply as a selectable via) includes a BEOL thin film transistor structure, which can be used to select (or deselect) the BEOL selectable via ad hoc. When such a via is selected, a signal is allowed to pass through the via. Conversely, when such a via is not selected (deselected), a signal is not allowed to pass through the via. For instance, a signal passing through a selectable via may be a signal carried by an interconnect connected to or otherwise coupled to the selectable via. As will be apparent in light of this disclosure, this selectable characteristic allows multiple selectable vias to share a global interconnect, wherein one or more signals may be switched into the global interconnect by way of a corresponding selectable via. Thus, such a global interconnect can be reconfigured to carry the signal(s) passed by one or more of the selectable vias that are sharing the global interconnect. The ability of selectable vias to share a global interconnect provides numerous benefits and enables many applications (e.g., one-to-many multiplexors and many-to-many multiplexors), as will be appreciated.

General Overview

As previously explained, there are a number of non-trivial and unresolved issues associated with the continued downscaling of integrated circuits (ICs) and the resulting need to connect the large numbers of transistors and other features included in the ICs. For instance, the large numbers of interconnects needed to connect these transistors and other features has resulted in the use of interconnects of shrinking dimensions, even in the upper interconnect layers. For example, it may not be uncommon for an interconnect conductor to be a few atoms thick. Moreover, the distance between interconnect wires may be a few atoms wide, even in the upper interconnect layers. Interconnects of such dimensions, in turn, cause an increase in the resistance-capacitance (RC) delay and a degradation in performance. RC delay commonly refers to the delay in signal speed and propagation experienced in a circuit as a function of the product of the resistance and capacitance of the circuit components. Unfortunately, RC delay continues to increase with the continued scaling of ICs and the need for increased numbers of interconnects.

Thus, and in accordance with an embodiment of the present disclosure, selectable vias are provided. In an embodiment, a selectable via includes a thin film transistor structure, which allows the selectable via to be selected (or deselected) ad hoc such that a signal passes through the selectable via when selected and no signal passes through the selectable via when not selected (deselected). Because of the selectable nature of a selectable via, the selectable via does not require a dedicated interconnect. Rather, the selectable characteristic allows multiple selectable vias to be connected or otherwise coupled to a global interconnect, thus causing the global interconnect to be in effect shared amongst the multiple selectable vias. This effectively allows the global interconnect to be larger. In some embodiments, multiple selectable vias can share a single global interconnect. In other embodiments, multiple selectable vias can share multiple global interconnects, wherein the number of shared global interconnects is less than the number of selectable vias, for instance. In any such cases, a global interconnect that is shared by selectable vias effectively becomes a reconfigurable global interconnect in that the interconnect carries or otherwise transmits the signal(s) passing through one or more of the selectable vias.

As will be apparent in light of this disclosure, the sharing of global interconnects results in reduced numbers of interconnects in a given interconnect structure of an integrated circuit. Moreover, reducing the numbers of interconnects in an interconnect structure provides more area for the interconnects, including the reconfigurable global interconnects. This in turn allows the interconnects within a given interconnect layer or structure, including the shared global interconnects, to be larger and/or spaced further apart. As will be appreciated, a larger (e.g., wider, thicker, etc.) interconnect carries lower resistance (R), and interconnects that are spaced further apart provide lower capacitance (C). This produces improvements in interconnect and via resistance and capacitance and therefore, RC performance. Numerous other such benefits, as well as other configurations and embodiments, will be apparent in light of this disclosure.

Use of the techniques and structures provided herein may be detectable using tools such as electron microscopy including scanning/transmission electron microscopy (SEM/TEM), scanning transmission electron microscopy (STEM), nano-beam electron diffraction (NBD or NBED), and reflection electron microscopy (REM); composition mapping; x-ray crystallography or diffraction (XRD); energy-dispersive x-ray spectroscopy (EDX); secondary ion mass spectrometry (SIMS); time-of-flight SIMS (ToF-SIMS); atom probe imaging or tomography; local electrode atom probe (LEAP) techniques; 3D tomography; or high resolution physical or chemical analysis, to name a few suitable example analytical tools. In particular, in some embodiments, such tools may indicate the presence of a reconfigurable interconnect structure that includes a selectable via, as variously described herein. For example, TEM can be useful to show a cross-section of the interconnect structure, including a via having a thin film transistor structure as variously described herein. Numerous configurations and variations will be apparent in light of this disclosure.

It is noted that designations such "above" or "below" or "top" or "bottom" or "top side" or "bottom side" are not intended to necessarily implicate a limitation as to orientation of the embodiments described herein. Rather, such terminology is simply used in a relative sense to consistently describe a structure as it exists in any one particular orientation and as illustrated herein.

Note that the expression "active material" or "active channel structure material" as used herein simply refers to materials as variously noted herein (such as TMD material), and is not intended to imply that the material is currently electrically biased or otherwise in a conductive state where carriers are mobile within the material, as will plainly be apparent and appreciated. For instance, a given active material need not be connected (whether directly or indirectly) to any power source whatsoever to be considered an active material. Nor does the active material need to be in a conducting state to be considered an active material.

Likewise, the use herein of expressions such as "channel region" or "channel portion" or "active semiconductor channel structure" or "source region" or "source portion" or "drain region" or "drain portion" simply refers to specific locations of a transistor structure, and is not intended to imply that the transistor itself is currently electrically biased or otherwise in a conductive state where carriers are mobile within the channel region, as will be plainly apparent and appreciated. For instance, a given transistor need not be connected (whether directly or indirectly) to any power source whatsoever to have a channel region.

Also note that the use of "source/drain" herein is simply intended to refer to a source region or a drain region or both a source region and a drain region. To this end, the forward slash ("/") as used herein means "and/or" unless otherwise specified, and is not intended to implicate any particular structural limitation or arrangement with respect to source and drain regions, or any other materials or features that are listed herein in conjunction with a forward slash.

Further, materials that are "compositionally different" or "compositionally distinct" as used herein refers to two materials that have different chemical compositions. This compositional difference may be, for instance, by virtue of an element that is in one material but not the other (e.g., SiGe is compositionally different from silicon), or by way of one material having all the same elements as a second material but at least one of those elements is intentionally provided at a different concentration in one material relative to the other material (e.g., SiGe having 70 atomic percent germanium is compositionally different than from SiGe having 25 atomic percent germanium). In addition to such chemical composition diversity, the materials may also have distinct dopants (e.g., gallium and magnesium) or the same dopants but at differing concentrations. In still other embodiments, compositionally distinct materials may further refer to two materials that have different crystallographic orientations. For instance, (110) silicon is compositionally distinct or different from (100) silicon. Creating a stack of different orientations could be accomplished, for instance, with blanket wafer layer transfer.

As also used herein, the term "low-k" refers to a material having a dielectric constant equal to or less than that of silicon dioxide ($SiO_2$), which has a value of 3.9 according to some measurement methods. Examples of low-k materials include amorphous carbon, aluminum oxide ($Al_2O_3$), spin-on glass, silicon oxycarbides (SiOCH), fluorine-doped $SiO_2$, carbon-doped $SiO_2$, and silsesquioxanes, to provide a few examples. As also used herein, the term "high-k" refers to materials having a dielectric constant greater than that of silicon dioxide ($SiO_2$). Examples of high-k dielectric materials include hafnium dioxide ($HfO_2$), zirconium dioxide ($ZrO_2$) and titanium dioxide ($TiO_2$) to provide some examples.

System Architecture

FIG. 1 illustrates an example integrated circuit structure including back end of line (BEOL) selectable vias arranged to provide a global interconnect, in accordance with an embodiment of the present disclosure. As can be seen, the structure includes three interconnect layers or structures (102, 106, and 110) in a stacked arrangement above a device layer. Each interconnect layer generally includes an insulator material 114 with one or more conductive interconnect features therein. Etch stops (104 and 108) separate the layers. In more detail, a first interconnect structure 102 includes a first etch stop 104 formed thereon, a second interconnect structure 106 includes a second etch stop 108 formed thereon, and a third interconnect structure 110 includes a third etch stop 112 formed thereon. Second interconnect structure 106 is formed above first etch stop 104, and third structure 110 is formed above second etch stop 108. Each etch stop caps and hermetically seals the structure below, in some such embodiments. Although three distinct layers or structures are shown, other embodiments may have fewer layers or more layers, as will be appreciated.

As can be further seen in FIG. 1, first structure 102 may be a lower interconnect layer or structure that includes local interconnects 120, which may couple to, for example, transistors (e.g., non-planar metal oxide semiconductor transistors) and other features included on one or more substrates in a given device layer 101 of the integrated circuit. As will be appreciated, device layer 101 shown is simply an example and any number of device layer configurations can be used including those having, for instance, planar and/or non-planar metal oxide semiconductor (MOS) transistors formed on a bulk semiconductor substrate or a semiconductor-on-insulator substrate. In some example cases, for instance, the device layer 101 includes FinFETs and/or nanowire transistors formed on a silicon substrate, or a germanium substrate, or a SiGe substrate, or a group III-V material substrate such as gallium arsenide substrate, or a silicon-on-oxide or germanium-on-oxide substrate. The example device layer 101 shown in FIG. 1 further includes an inverter and logic (e.g., field programmable gate array), although any number of devices may be included, such as amplifiers, filters, timers, clock circuits, diodes, NAND-gates, NOR-gates, OR-gates, etc, depending on the application, as will be appreciated. Third interconnect structure 110 may be an upper interconnect layer or structure that includes global interconnect 118. In this example embodiment, global interconnect 118 is shared by a number of lower level reconfigurable or selectable interconnect features of second interconnect structure 106, which will be discussed in turn. Note that a given interconnect layer or structure may include any number of global interconnects 118 and/or any number of standard interconnect features, such as back end interconnect 116. Interconnect features include, for instance, vertical metal vias and lateral metal runs or lines. As will be further appreciated, a metal via may land on another metal via or a metal line included in the same interconnect layer or a neighboring interconnect layer, and in some cases may be partially landed vias.

Second interconnect structure 106 includes a number of standard vias and selectable vias. In particular, the example configuration shown in FIG. 1, second interconnect structure 106 includes seven vias 106a-106g, in the particular cross-section depicted. In this example case, leftmost via 106g is a standard via that couples a local interconnect 120 in a lower layer (first interconnect structure 102) to a back end interconnect 116 in an upper layer (third interconnect structure 110). The remaining six vias 106a-106f in second interconnect structure 106 are each selectable vias. Each selectable via 106a-106f couples a respective local interconnect 120 in first interconnect structure 102 to global interconnect 118 in third interconnect structure 110. As can be seen, a first set of selectable vias 106a-106c couples each of its respective local interconnects 120 to a first (left) portion of the global interconnect 118 in third interconnect structure 110. Similarly, a second set of selectable vias 106d-106f couples each of its respective local interconnects 120 to a second (right) portion of global interconnect 118. As will be appreciated, note that while two sets of selectable vias (106a-c and 106d-f) are provided in second interconnect structure 106 for illustration purposes, numerous other arrangements of selectable vias (e.g., with respect to the number of sets of selectable vias, numbers of selectable vias in each set, and the surrounding features) will be apparent. In addition, such an arrangement of selectable vias can exist in any interconnect layer in a given stack of interconnect layers, and in a more general sense, in any integrated circuit structure having multiple layers of conductive features within a body of dielectric or insulator material.

In some embodiments, as can be seen in FIG. 1, each selectable via 106a-106f includes a thin film transistor device or structure. In some such example embodiments, each thin film transistor structure includes a gate structure to receive a gate bit or drive signal, which can be used to turn 'ON' or activate the thin film transistor. In the 'ON' or activated state, a channel forms between the source (S) and drain (D) of the thin film transistor, which in turn allows a signal to pass from the source (S) to the drain (D). Conversely, in the 'OFF' or deactivated state, the channel between the source (S) and drain (D) of the thin film transistor ceases to conduct, which in turn prevent signals from passing from the source (S) to the drain (D). In this manner, and as will be appreciated in light of this disclosure, the thin film transistor operates as a selectable via that can be selected (to pass signal from one interconnect feature to another) or deselected (to block signal from so passing).

By way of example, the gate structure of thin film transistor structure of selectable via 106a receives a gate bit or other drive signal to select selectable via 106a. When selected, the signal from the corresponding local interconnect 120 in the left side of first interconnect structure 102 passes through selectable via 106a to global interconnect 118 in third interconnect structure 110. Selectable vias 106b and 106c can similarly be selected using the gate structure of respective thin film transistor structures such that the signal from the corresponding local interconnect 120 in the left side of first interconnect structure 102 passes through the selected selectable via (106b or 106c) to global interconnect 118 in third interconnect structure 110. In a similar fashion, global interconnect 118 can carry the signal to the second set of selectable vias 106d-106f, which can then selectively pass a given signal to a corresponding local interconnect 120 on the right side of first interconnect structure 102. In still other example embodiments, signals can be passed from local interconnects 120 on the right side of first interconnect structure 102 to global interconnect 118, in a similar fashion as the signals from the local interconnects 120 on the left side of first interconnect structure 102 are passed to global interconnect 118. In such cases, global interconnect 118 can carry those signals to yet another upper interconnect layer (not shown) for further routing by way of one or more vias (whether standard or selectable). Thus, in any such cases, global interconnect 118 can be shared by the first and second sets of selectable vias 106a-106f.

Insulator 114 can be any suitable insulator, such as silicon dioxide, silicon nitride, porous versions of these, or any other suitable insulator or dielectric material. Local and global interconnects 120 and 118 can be any conductive material, such as copper, silver, gold, aluminum, tungsten, or other suitable interconnect metals and alloys thereof. In some embodiments, the thin film transistor structure is implemented in the BEOL using standard thin film transistor technology. Any number of processes and materials can be used to implement the thin film transistor. In some specific embodiments, the active semiconductor channel structure material can include, for example, a transition metal dichalcogenide (TMD). TMDs are semiconductors of type $M_aY_bX_c$, where M, Y, X can be any of scandium (Sc), titanium (Ti), vanadium (V), chromium (Cr), manganese (Mn), iron (Fe), cobalt (Co), selenium (Se), tellurium (Te), nickel (Ni), copper (Cu), zinc (Zn), yttrium (Y), zirconium (Zr), niobium (Nb), molybdenum (Mo), meitnerium (Mt), darmstadtium (Ds), roentgenium (Rg), indium (In), aluminum (Al), technetium (Tc), ruthenium (Ru), rhodium (Rh), palladium (Pd), silver (Ag), cadmium (Cd), hafnium (Hf), tantalum (Ta), tungsten (W), rhenium (Re), osmium (Os), iridium (Ir), sulfur (S), chlorine (Cl), hydrogen (H), oxygen (O), platinum (Pt), gold (Au), mercury (Hg), rutherfordium (Rf), dubnium (Db), seaborgium (Sg), bohrium (Bh), hassium (Hs), gallium (Ga), or thallium (Tl), and a, b, c can be any number between 0 and 100. In other embodiments, the active semiconductor channel structure material can include any of other suitable thin film semiconductor materials such as amorphous silicon, microcrystalline silicon, and polysilicon, to name a few examples. In accordance with some embodiments, a thin film transistor structure as described herein effectively includes a gate-all-around configuration (e.g., nanowire or nanoribbon) in a vertical or substantially vertical transistor architecture where the channel regions extend vertically between a lower source/drain region and an upper source/drain region.

Variations on the interconnect structure shown will be appreciated. For instance, while first, second, and third interconnect layers are shown in this particular example embodiment, in other embodiments, local interconnects 120 and/or global interconnect 118 can be in the same interconnect layer as selectable vias 106. In such cases, input signals can be provided to inputs (e.g., sources) of the selectable via inputs from the same layer and/or a different layer, and output signals can be provided at outputs (e.g., drains) of the selectable via for passing within the same layer and/or a different layer. Many such configurations can be made.

Figure 2A:
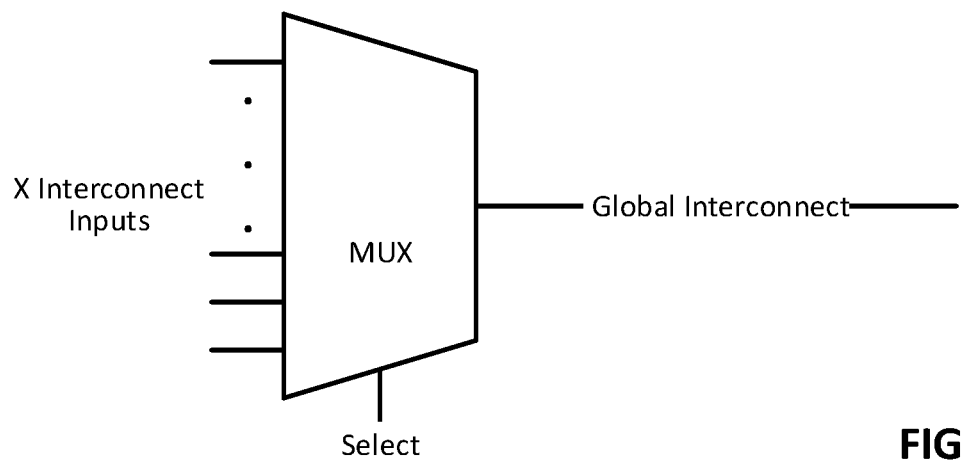
FIG. 2A illustrates a many-to-one multiplexor configured with selectable vias, in accordance with an embodiment of the present disclosure.

FIG. 2A illustrates a many-to-one multiplexor configured with selectable vias, in accordance with an embodiment of the present disclosure. A multiplexer (MUX) refers to a device comprising at least two inputs, at least one select line, and at least one output. The select line (or lines) is used to select which input to send to the output. For example, a 2:1 MUX couples one of two inputs to the output based on the state of the select line. A 4:1 MUX couples one of four inputs to the output based on the states of the select lines. In a more general sense, an X:1 MUX couples one of X inputs to the output based on the states of the select lines. Note that reversing the direction of the signal into and out of the multiplexer effectively converts a MUX into a demultiplexer (DEMUX). In particular, FIG. 2A shows an X:1 MUX implementation using selectable vias. In some such cases, the selectable vias may be implemented in a BEOL interconnect layer, such as discussed with reference to FIG. 1, although other contexts will be appreciated. As can be seen, the X:1 MUX includes X interconnects as inputs and one global interconnect as the output. For instance, each interconnect input to the X:1 MUX can be, for example, a local interconnect as further depicted in FIG. 1. In the X:1 MUX configuration, the X interconnect inputs each couple to the global interconnect output through a selectable via. To select a particular one of the interconnect inputs to send to the global interconnect output, the select lines of the X:1 MUX can be used to activate (turn 'ON') the selectable via coupled to the particular interconnect input.

Figure 2B:
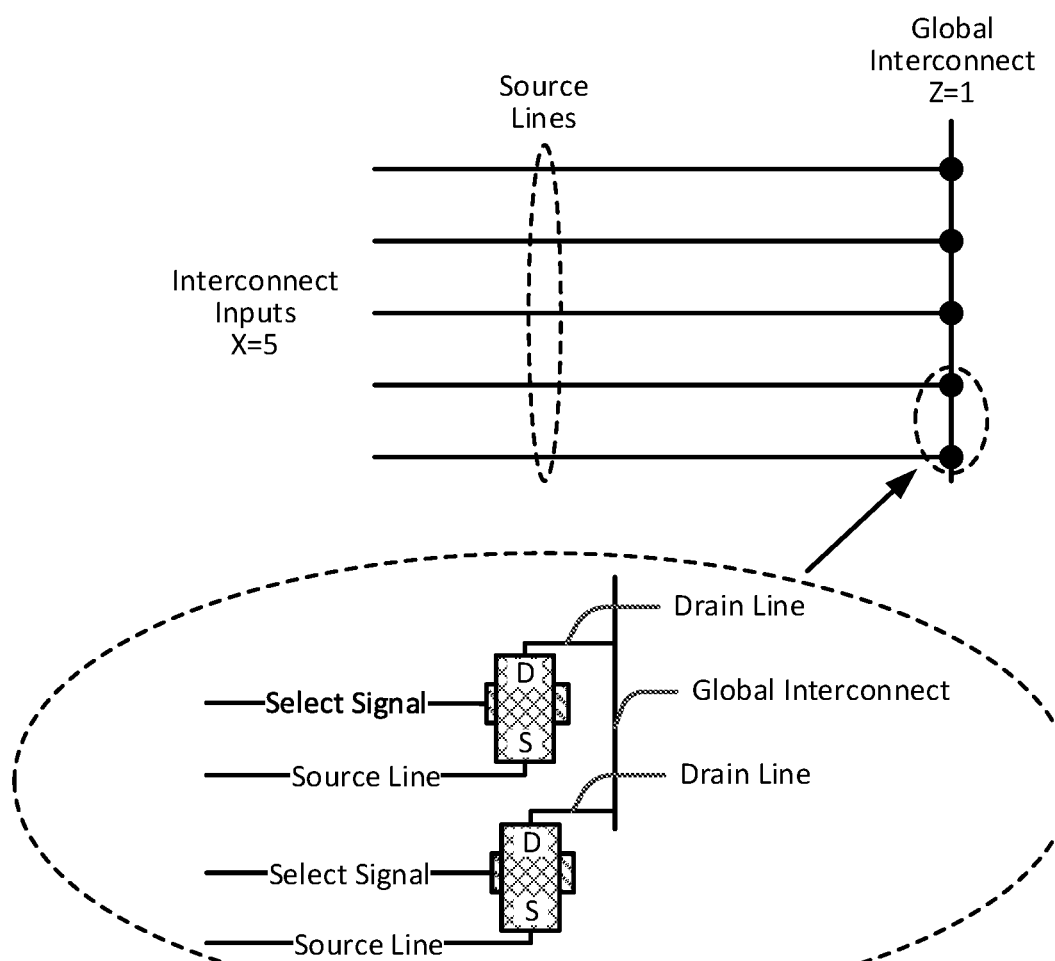
FIG. 2B shows an example 5:1 MUX configured with selectable vias, in accordance with an embodiment of the present disclosure.

By way of an example, FIG. 2B shows an example 5:1 MUX configured with selectable vias, in accordance with an embodiment of the present disclosure. As can be seen, each of the five input interconnects is coupled to a respective selectable via. The global interconnect is coupled to the outputs (e.g., drains) of the five selectable vias that couple their respective inputs (e.g., sources) to the respective input interconnects. Select lines of the 5:1 MUX can then be used to activate a select signal to one of the five selectable vias to select the input interconnect to send to the global interconnect.

Figure 3A:
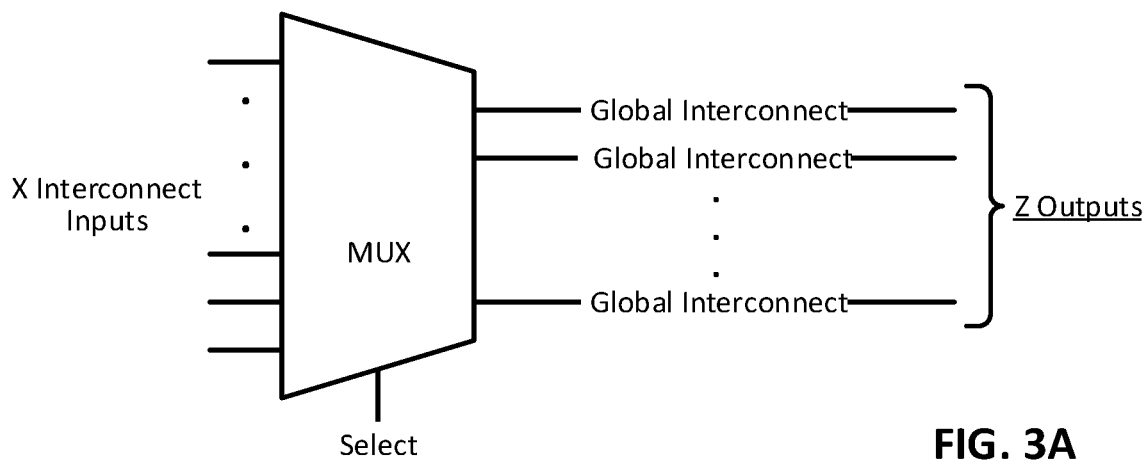
FIG. 3A illustrates a many-to-many multiplexor configured with selectable vias, in accordance with an embodiment of the present disclosure.

FIG. 3A illustrates a many-to-many multiplexor configured with selectable vias, in accordance with an embodiment of the present disclosure. Just as with the example embodiment shown in FIGS. 2A and 2B, the context may be a BEOL interconnect structure including, such as discussed with respect to FIG. 1. In particular, FIG. 3A shows an X:Z MUX implementation using selectable vias. As can be seen, the X:Z MUX includes X interconnects as inputs and Z global interconnects as outputs. As previously indicated, each interconnect input to the X:Z MUX can be a local interconnect, although input signals may be provided by any number of other interconnect features. In the X:Z MUX configuration, the X interconnect inputs couple to the Z global interconnect outputs through X*Z selectable vias. For instance, in an example embodiment, each of the X interconnect inputs couple to the Z global interconnect outputs through Z selectable vias, where each of the Z selectable vias is associated with a respective one of the Z global interconnect outputs. To connect a signal on a first interconnect input to a first global interconnect output, the select lines of the X:Z MUX can be used to activate (turn 'ON') the selectable via that connects the first interconnect input to the first global interconnect output.

Figure 3B:
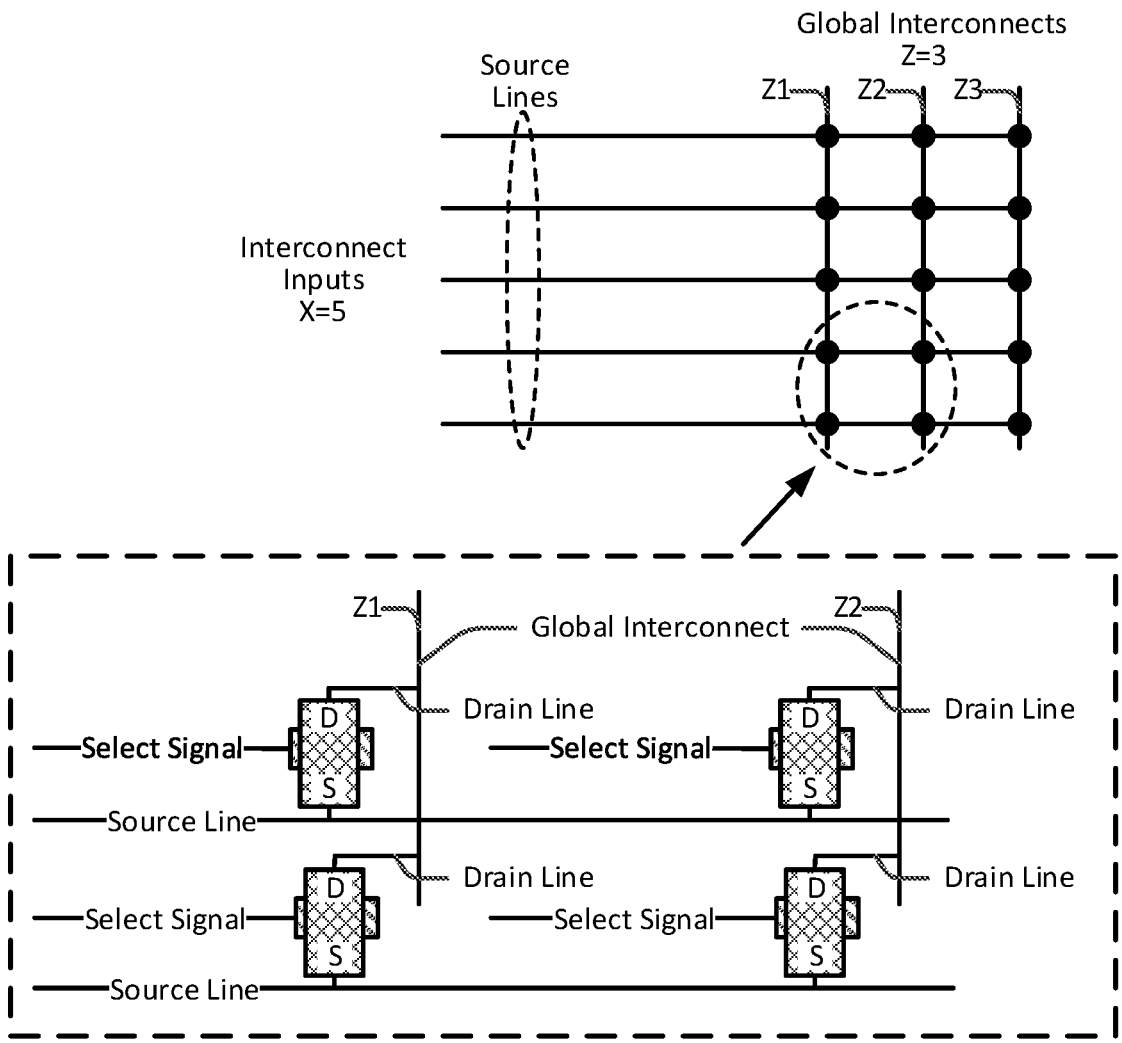
FIG. 3B shows an example 5:3 MUX configured with selectable vias, in accordance with an embodiment of the present disclosure.

By way of an example, FIG. 3B shows an example of a 5:3 MUX configured with selectable vias, in accordance with an embodiment of the present disclosure. As can be seen, each of the five input interconnects is coupled to each of the three output global interconnects though a respective selectable via. As such, each of the three global interconnects is coupled to a set of five selectable vias, wherein each of the five selectable vias in a set are coupled to a respective one of the five input interconnects. This results in three sets of five selectable vias that couple the five input interconnects to three global interconnects. Select lines of the 5:3 MUX can then be used to activate select signals to three of the 15 selectable vias, such that one selectable via is activated in each of the three sets of selectable vias. The input interconnect or interconnects coupled to the three activated selectable vias are sent to the three output global interconnects. Note that a single input interconnect can be sent to each of the three output global interconnects. Note also that two input interconnects can be sent to each of the three output global interconnects, where a first one of the two input interconnects is sent to one of the three output global interconnects and a second one of the two input interconnects is sent to two of the three output global interconnects. In a more general sense, any one, two, or three of the five input interconnects can be sent to the three output global interconnects.

Methodology

Figure 4A:
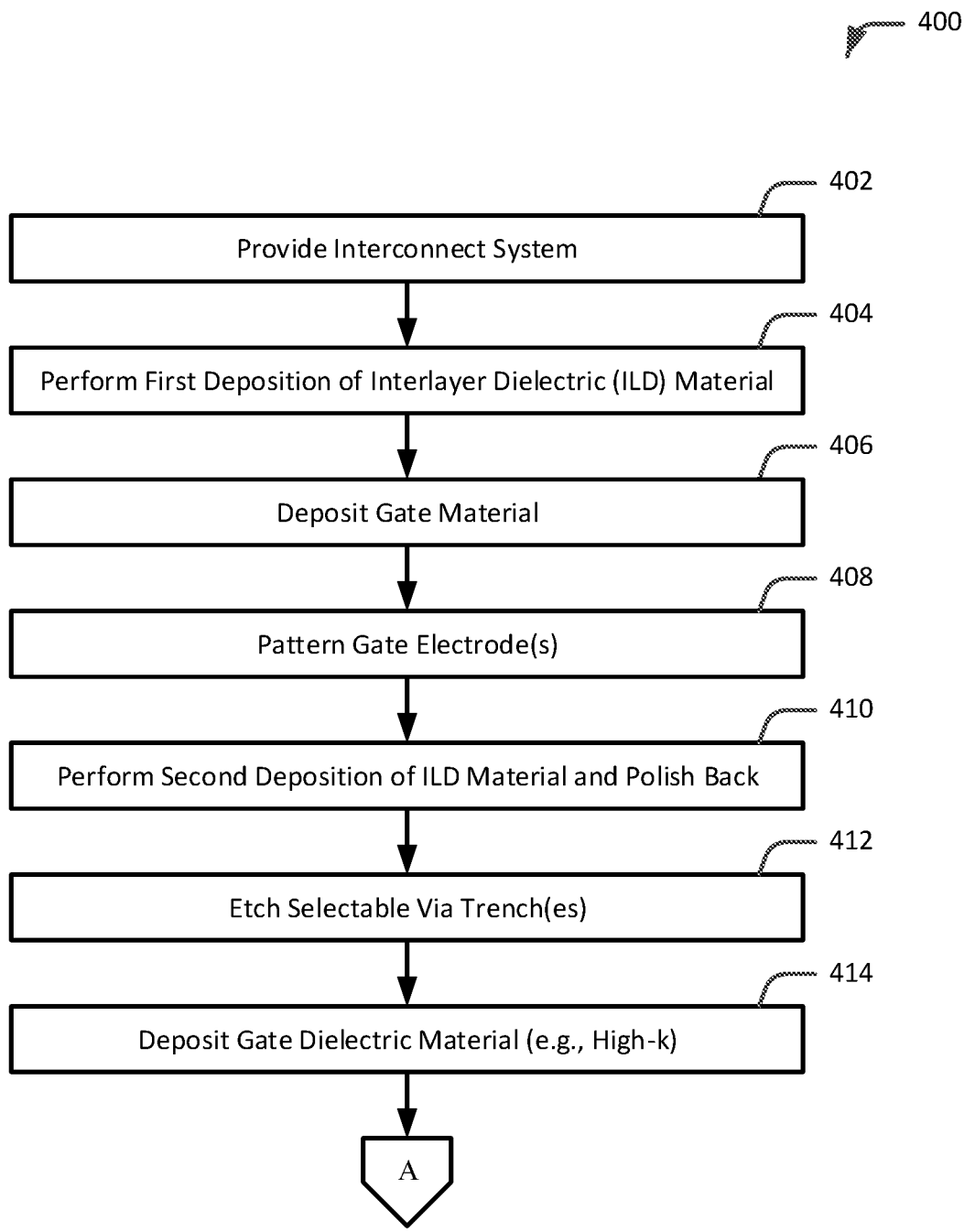
FIGS. 4A and 4B collectively illustrate an example process for forming a selectable via for back end of line, in accordance with an embodiment of the present disclosure.
Figure 4B:
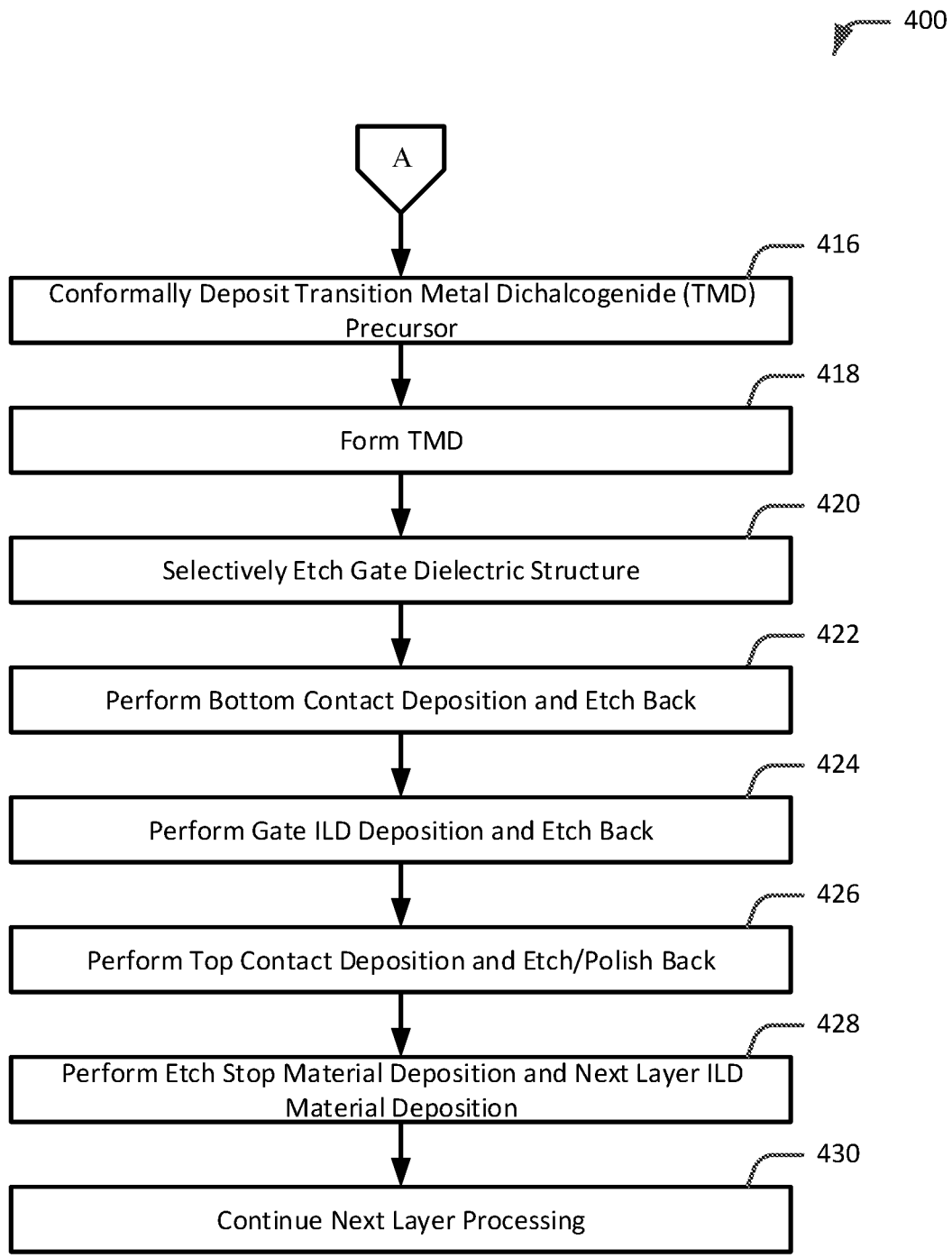
Figure 5A:
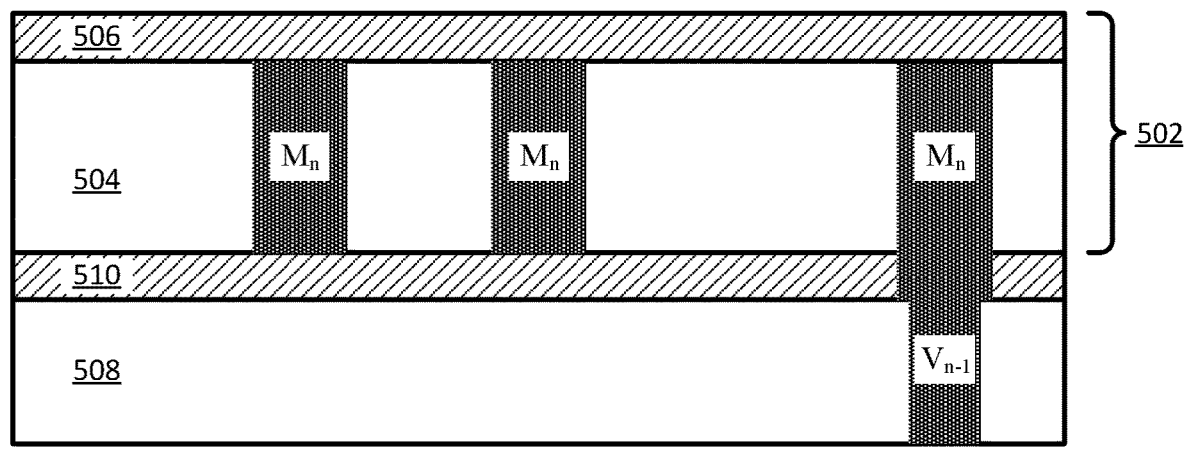
FIGS. 5A-5O illustrate cross-sectional views of example integrated circuit structures formed when carrying out the process of FIGS. 4A and 4B, in accordance with an embodiment of the present disclosure.
Figure 5B:
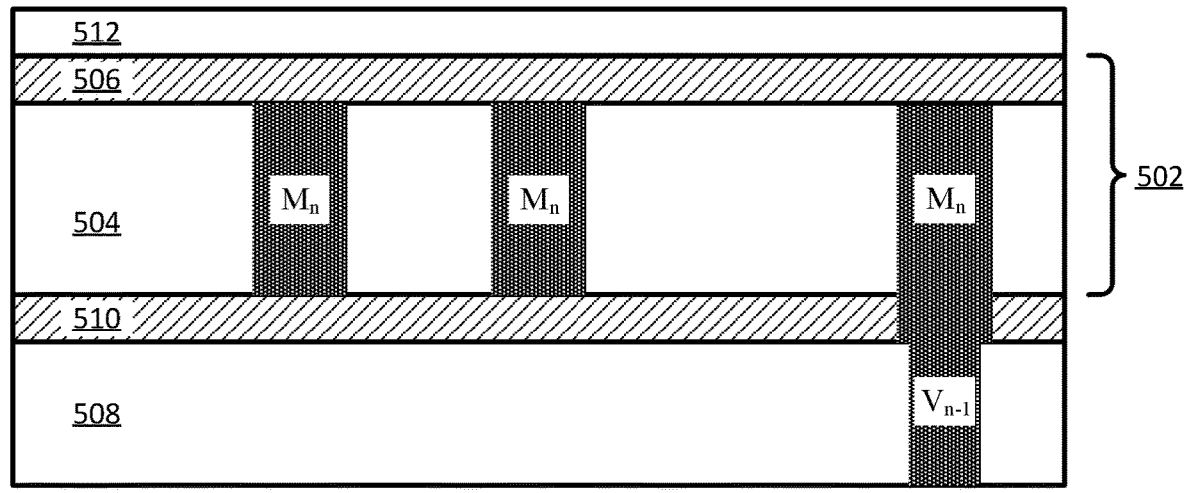
Figure 5C:
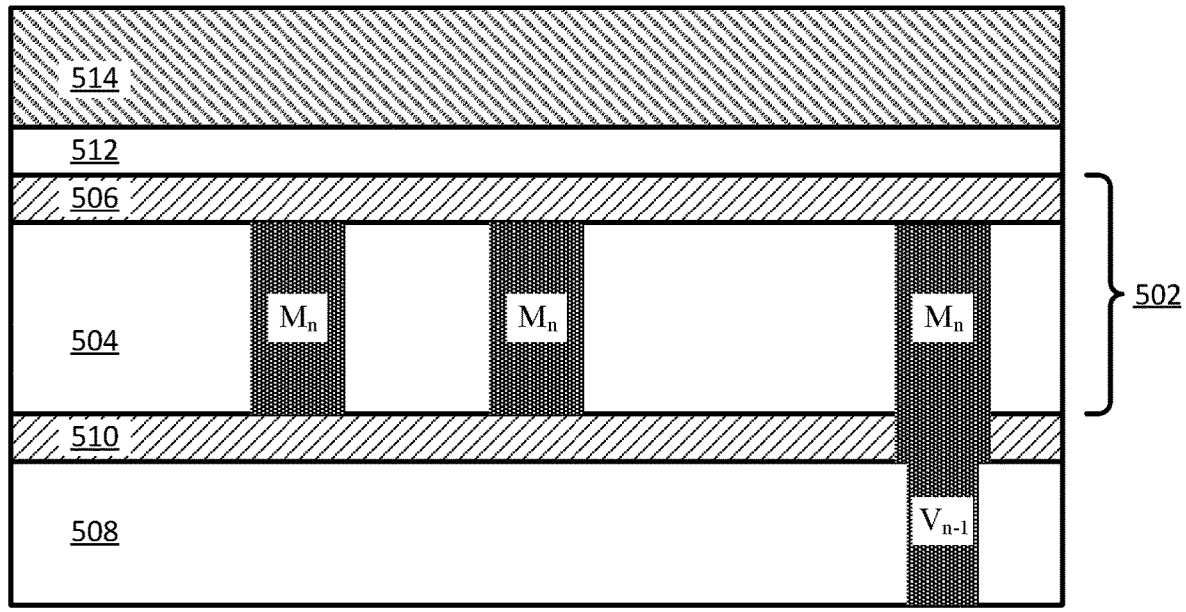
Figure 5D:
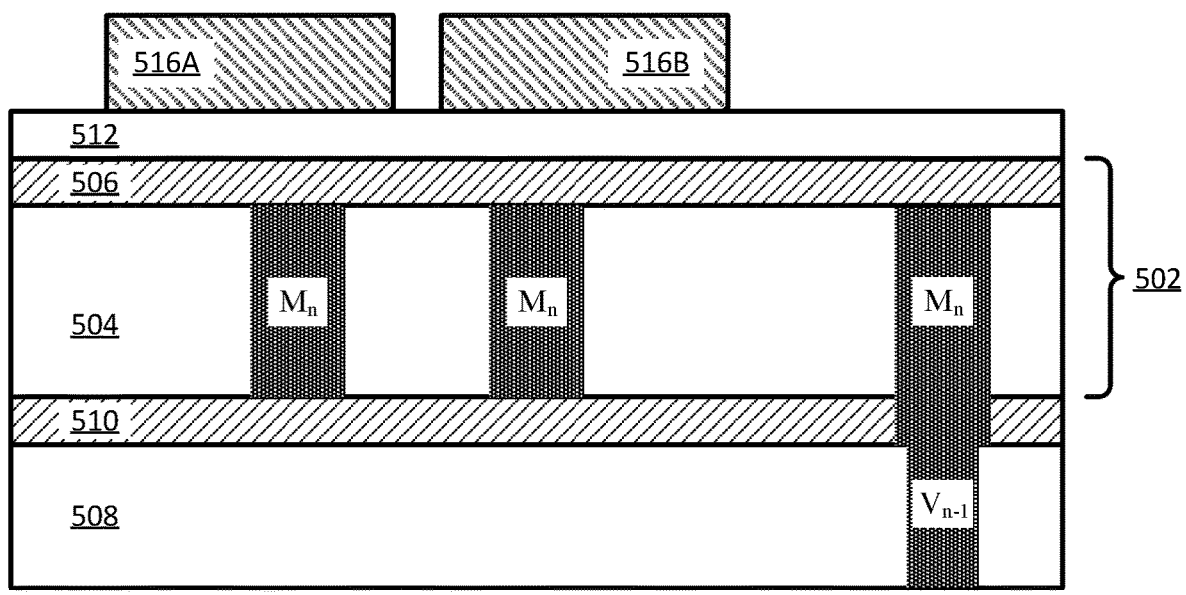
Figure 5E:
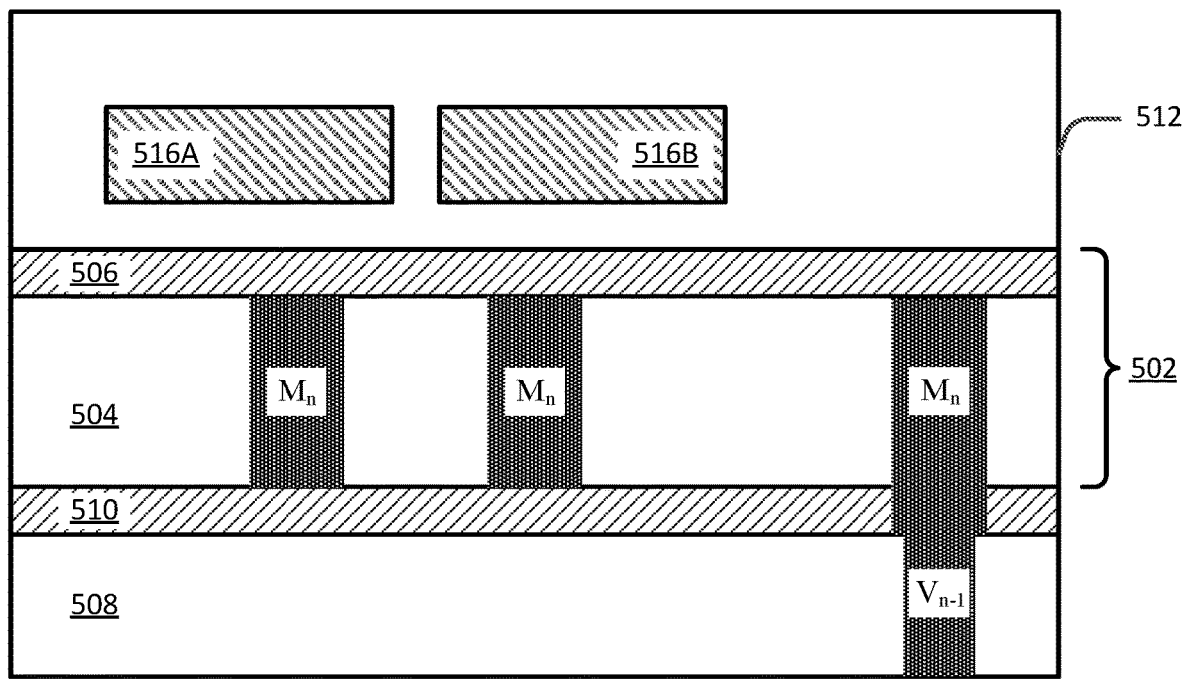
Figure 5F:
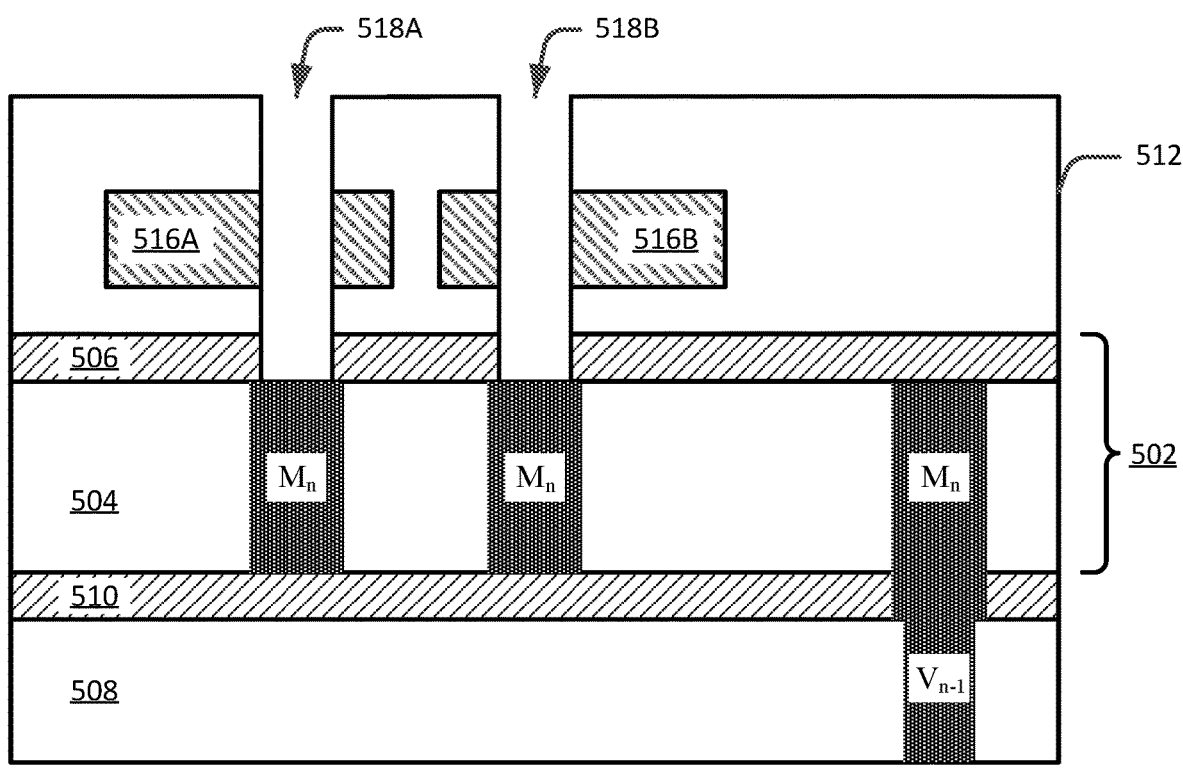
Figure 5G:
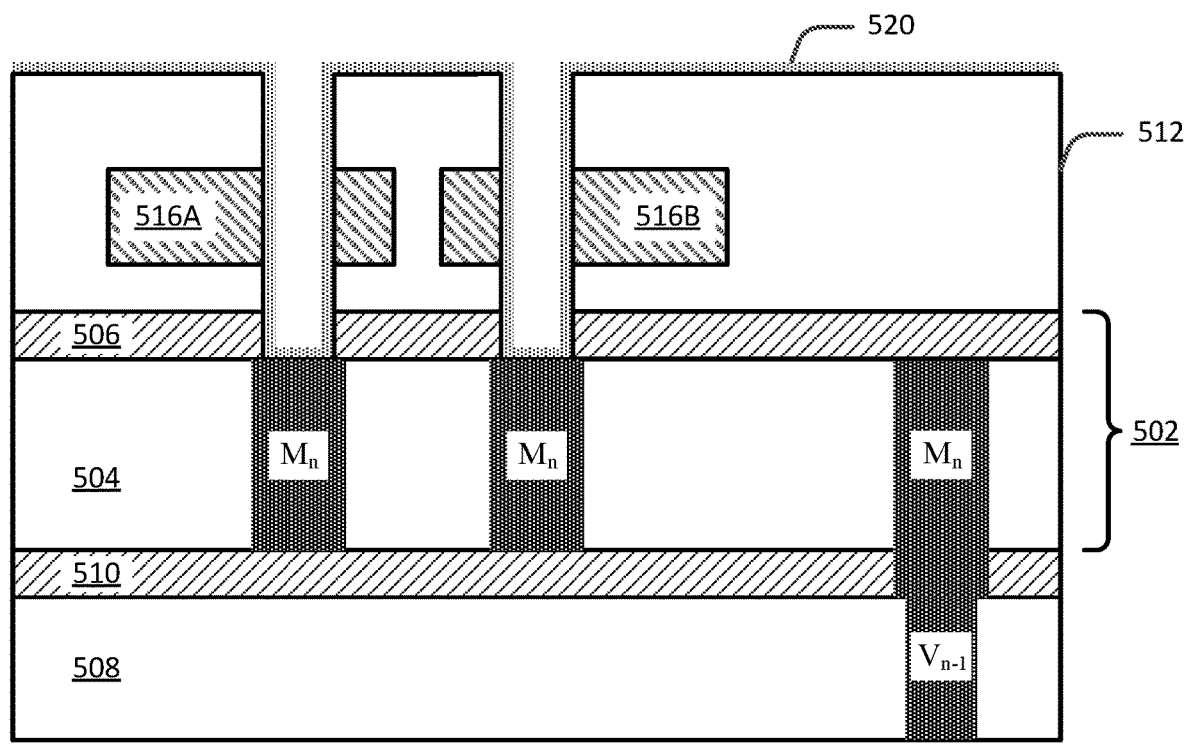
Figure 5H:
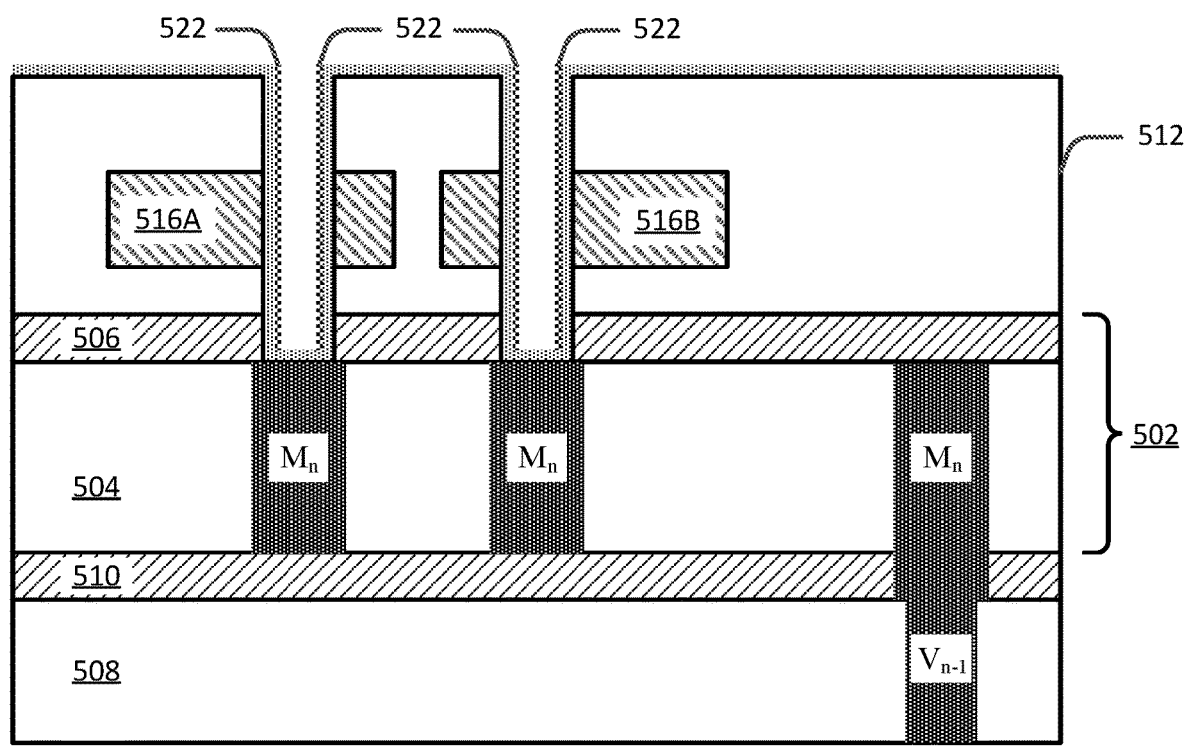
Figure 5I:
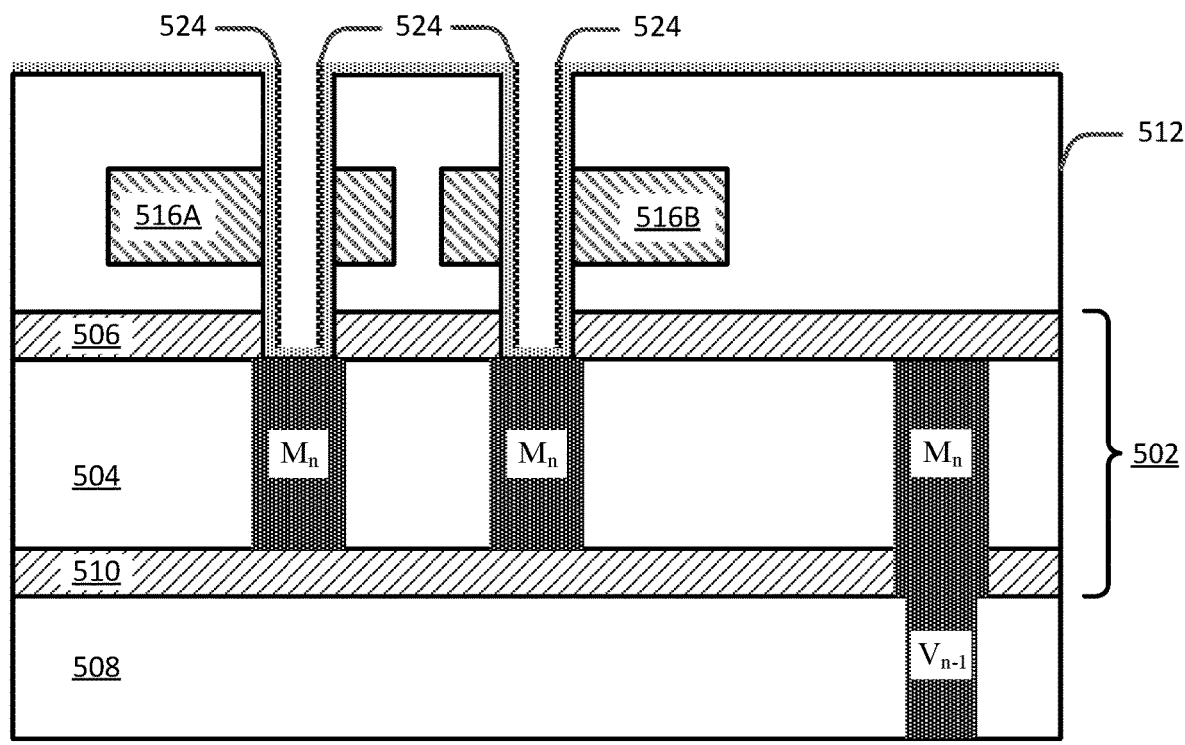
Figure 5J:
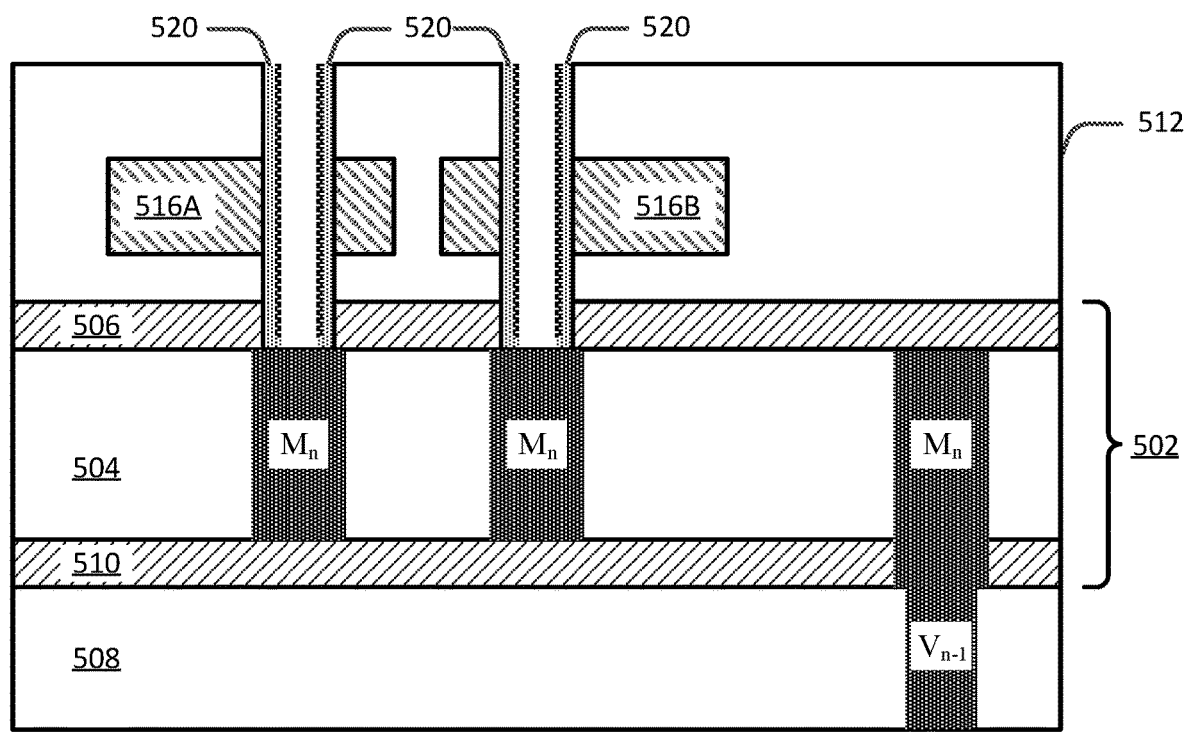
Figure 5K:
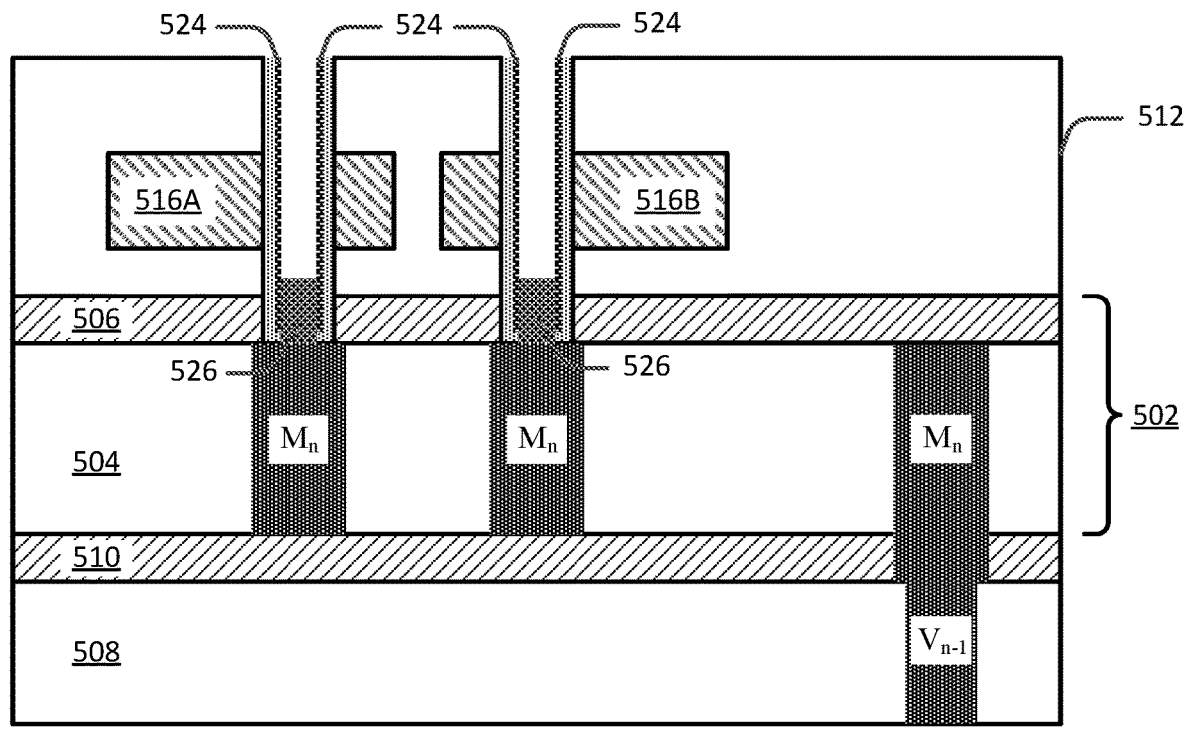
Figure 5L:
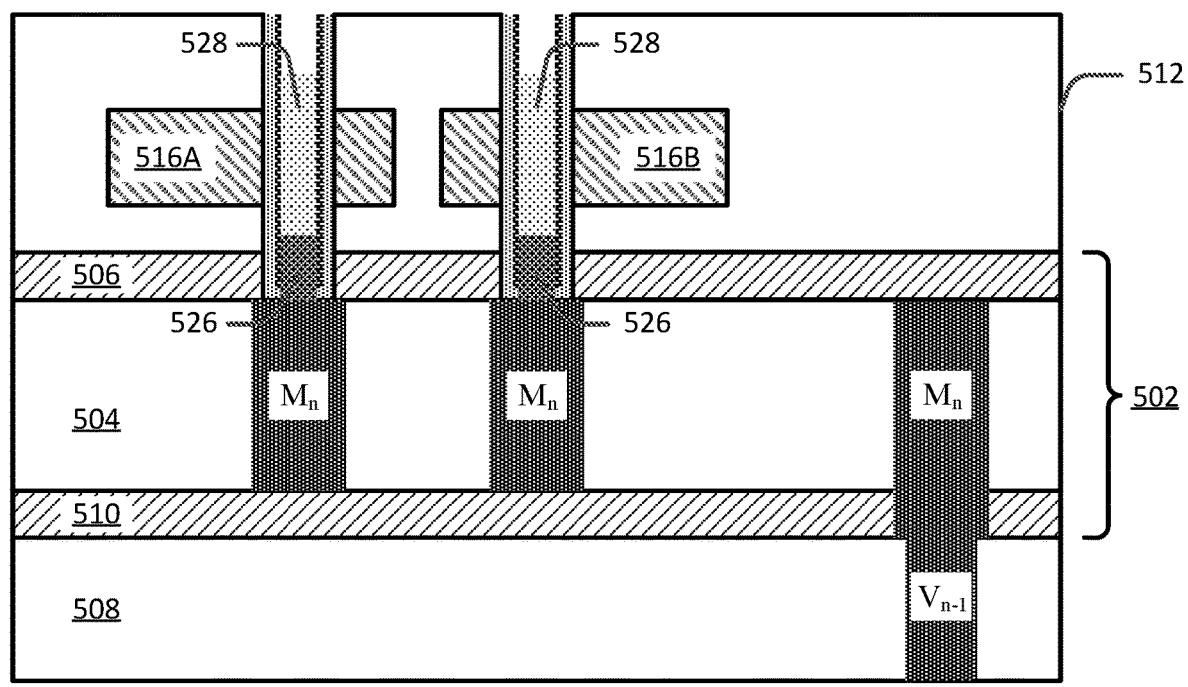
Figure 5M:
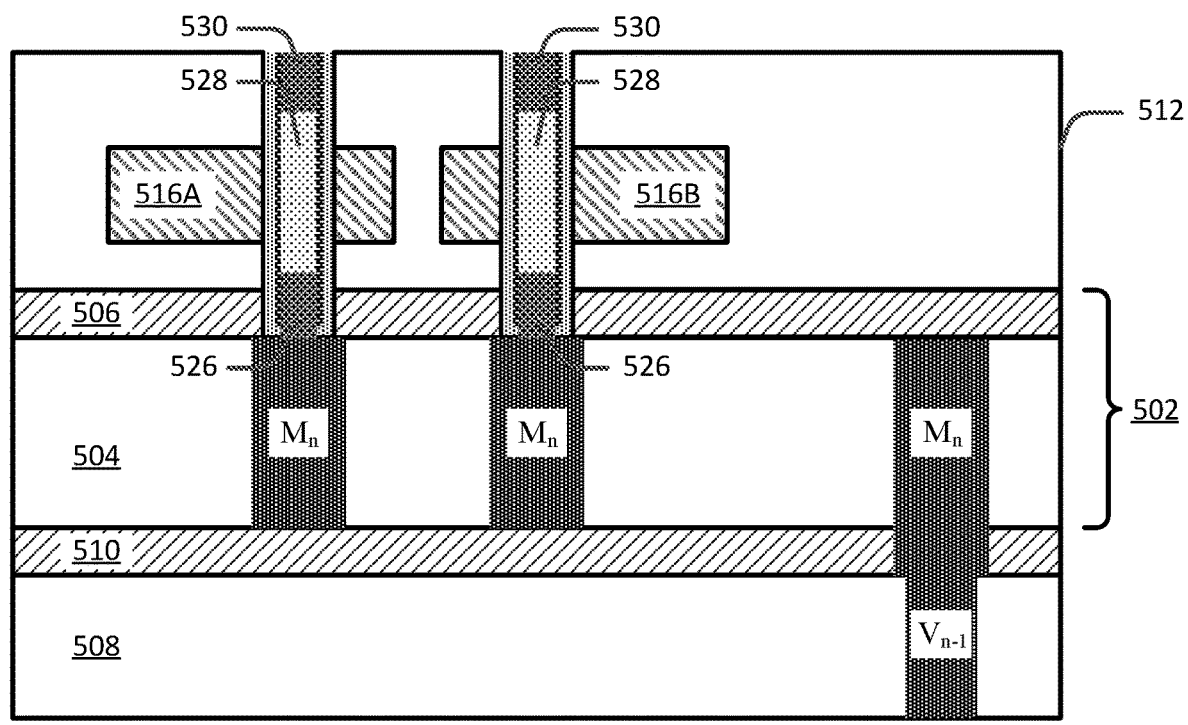
Figure 5N:
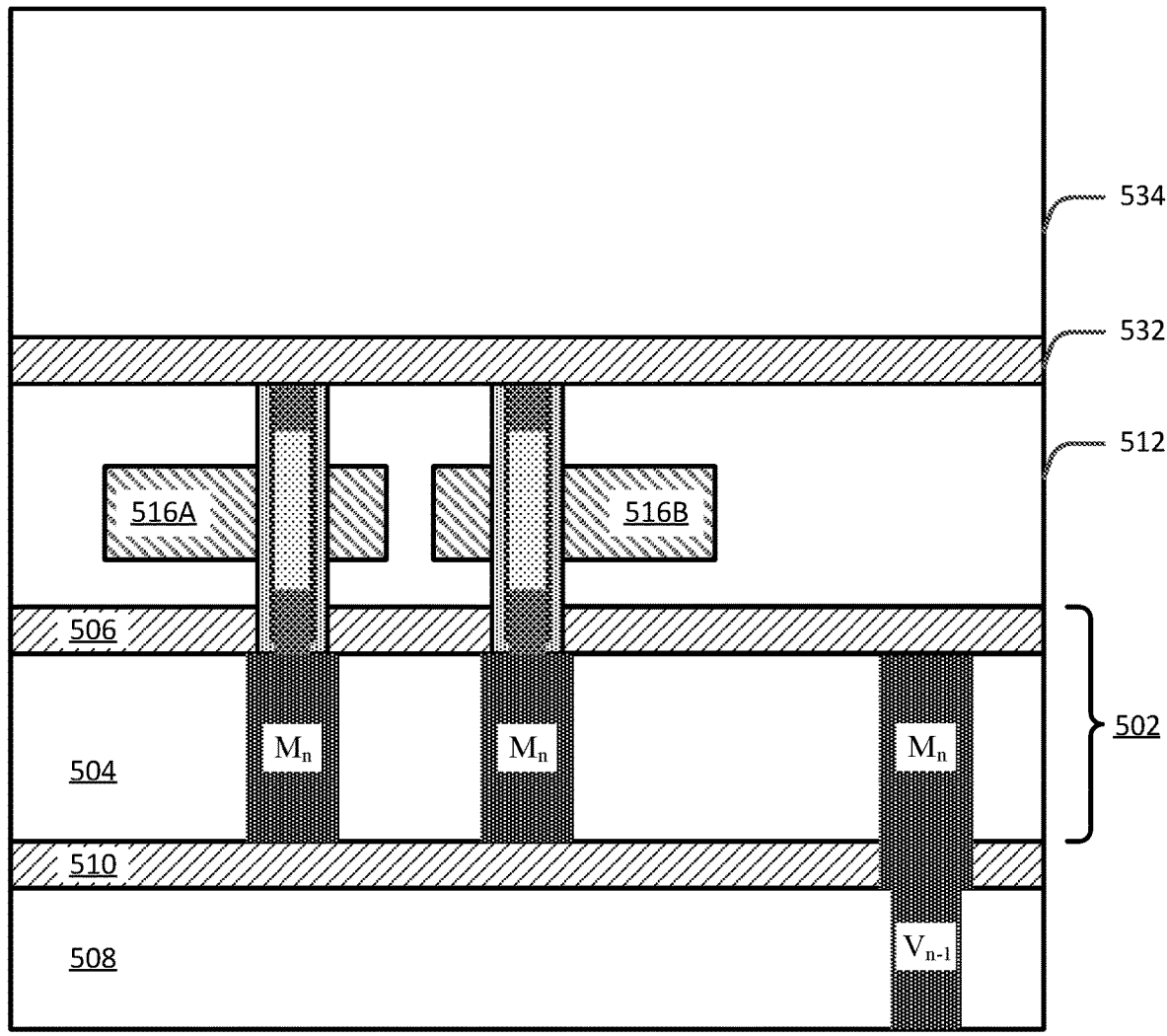
Figure 5O:
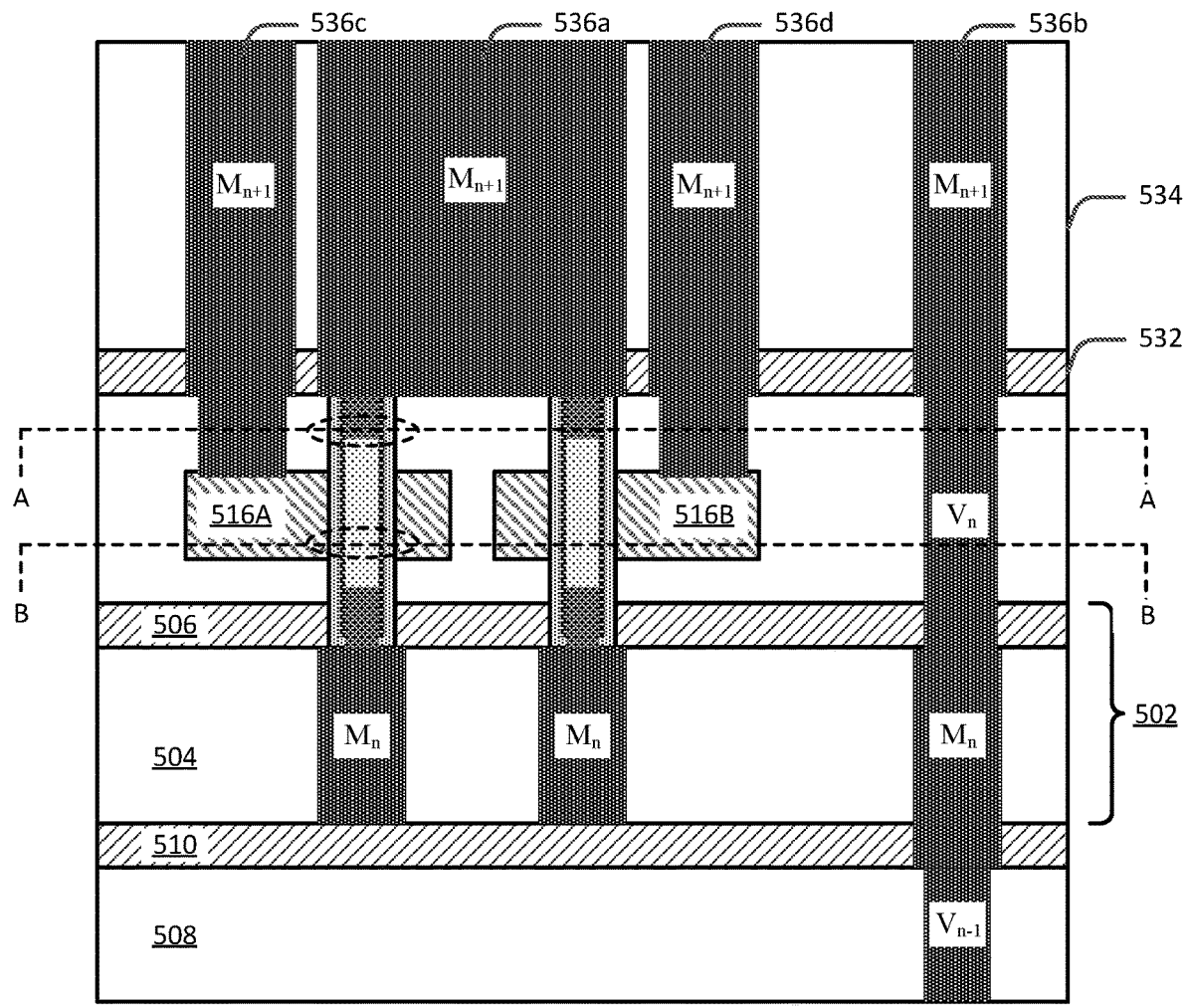
Figure 5O:
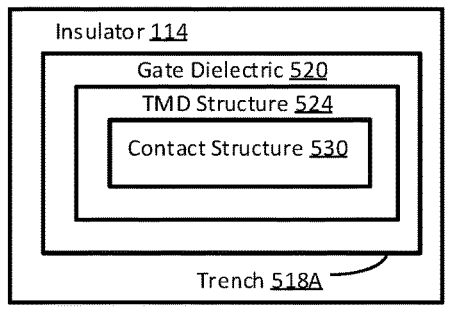
Figure 5O:
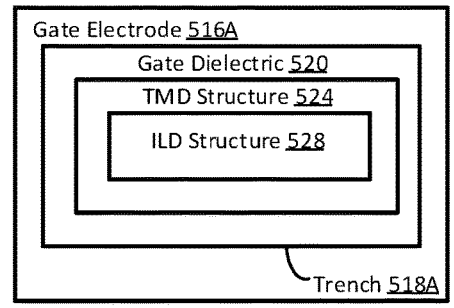

FIGS. 4A and 4B collectively illustrate an example process 400 for forming a selectable via for back end of line, in accordance with an embodiment of the present disclosure. FIGS. 5A-5O illustrate cross-sectional views of example integrated circuit structures formed when carrying out process 400 of FIGS. 4A and 4B, in accordance with an embodiment of the present disclosure. As will be further appreciated in light of this disclosure, process 400 can be carried out, for example, as part of the BEOL portion of any IC fabrication process. Concurrent reference to FIGS. 4A and 4B and FIGS. 5A-5O will facilitate explanation.

Note that deposition or epitaxial growth techniques (or more generally, additive processing) where described herein can use any suitable techniques, such as chemical vapor deposition (CVD), physical vapor deposition (PVD), atomic layer deposition (ALD), and/or molecular beam epitaxy (MBE), to provide some examples. Also note that etching techniques (or more generally, subtractive processing) where described herein can use any suitable techniques, such as wet and/or dry etch processing which may be isotropic (e.g., uniform etch rate in all directions) or anisotropic (e.g., etch rates that are orientation dependent), and which may be non-selective (e.g., etches all exposed materials at the same or similar rates) or selective (e.g., etches different materials that are exposed at different rates). Further note that other processing may be used to form the integrated circuit structures described herein as will be apparent in light of this disclosure, such as hardmasking, patterning or lithography (via suitable lithography techniques, such as, e.g., photolithography, extreme ultraviolet lithography, x-ray lithography, or electron beam lithography), planarizing or polishing (e.g., via chemical-mechanical planarization (CMP) processing), doping (e.g., via ion implantation, diffusion, or including dopant in the base material during formation), cleaning, and annealing, to name some examples.

With reference to FIG. 4A, process 400 commences at 402 with providing an interconnect system and/or device layer for further processing. FIG. 5A shows an example interconnect structure 502, in accordance with an embodiment. In some embodiments, interconnect structure 502 includes an $n^{th}$ metal layer 504 of an IC. As used herein, a metal layer generally refers to a layer that includes one or more metal or otherwise conductive features within a body of insulator or dielectric material, or simply a layer that consists essentially of or is all metal. Such layers are also referred to herein as interconnect layers, and one or more of such layers can be included in an interconnect structure. To this send, the terms "metal layer" and "interconnect layer" may be used interchangeably herein. Thus, a metal layer that is an interconnect layer is not to be limited to a layer that is all metal, as will be appreciated in a given context. This metal layer 504 is one metal layer (i.e., the $n^{th}$ metal layer) of an interconnect structure formed during the BEOL portion of the IC fabrication process. As can be seen, $n^{th}$ metal layer 504 includes metal lines $M_n$. The metal lines may interconnect the transistors and other features of the IC, for instance.

Interconnect structure 502 also includes a barrier layer or structure 506 above $n^{th}$ metal layer 504. Etch stop 506 caps $n^{th}$ metal layer 504 and prevents moisture uptake from $n^{th}$ metal layer 504, for instance. In some embodiments, etch stop 506 is composed of a suitable etch stop material. Example etch stop materials include, for instance, a nitride material such as silicon nitride (SiN), carbon-doped SiN, siliconoxycyanide (SiOCN), and metal oxides, to name a few examples. In some embodiments, etch stop 506 has a thickness in the range of, for instance, 2 nanometers (nm) to 150 nm. In general, the thickness of etch stop 506 is sufficient to hermetically seal $n^{th}$ metal layer 504. As will be appreciated in light of this disclosure, the thickness of etch stop 506 can vary greatly depending on the end use or target application, and the claimed invention is not limited to any particular range of thicknesses.

As shown, in some embodiments, $n^{th}$ metal layer 504 may be formed above a lower or preceding $(n-1)^{st}$ metal layer 508. In some such embodiments, $(n-1)^{st}$ metal layer 508 can be a layer of the interconnect structure that includes one or more vias (denoted V, i). A Mn metal line in $n^{th}$ metal layer 504 lands on a $V_{n-1}$ via in $(n-1)^{st}$ metal layer 508 to allow for a connection. In a similar fashion to etch stop 506 being formed on metal layer 504, a barrier layer or structure 510 may be formed above $(n-1)^{st}$ metal layer 508. Note that single and/or dual damascene processes may be used in forming the various conductive features of a given interconnect layer. Etch stop 510 is similar to etch stop 506 and the previous relevant discussion equally applied here.

With further reference to FIG. 4A, process 400 continues at 404 with performing a first deposition of interlayer dielectric (ILD) material. FIG. 5B shows an example resulting structure after the first deposition of an insulator material to form an ILD layer or structure 512 above etch stop 506, according to an embodiment. The first deposition of the ILD material for ILD structure 512 may include any suitable deposition processes, such as chemical vapor deposition (CVD), atomic layer deposition (ALD), physical vapor deposition (PVD), or any other suitable BEOL deposition processes. In some embodiments, the deposited ILD material may be planarized to remove any excess ILD material as needed using a suitable process, such as chemical mechanical planarization, or CMP. Example ILD materials include, for instance, an oxide (e.g., silicon dioxide), a carbon-doped oxide (CDO), organic polymers such as perfluorocyclobutane or polytetrafluoroethylene, fluorosilicate glass (FSG), and organosilicates such as silsesquioxane, siloxane, or organosilicate glass, or other suitable low-k dielectric material, to name a few examples. In some example cases, ILD structure 512 resulting from the first deposition has a thickness in the range of, for instance, 25 nm to 5 micrometers (μm). As will be appreciated in the light of this disclosure, the thickness of the first deposited ILD structure 512 can vary greatly depending on the end use or target application, and the claimed invention is not intended to be limited to any particular range of thicknesses.

With further reference to FIG. 4A, process 400 continues at 406 with depositing a gate material (or materials, as the case may be). FIG. 5C illustrates an example resulting structure after the deposition of the gate material(s) to form a gate material layer or structure 514 above ILD structure 512, according to an embodiment. Gate material structure 514 provides the material(s) to form the gate electrodes for the BEOL selectable vias. The deposition of gate material structure 514 may include any suitable deposition processes, such as CVD, ALD, PVD, or any other suitable BEOL deposition processes. In some embodiments, the deposited gate material may be planarized to remove any excess gate material as needed using a suitable process, such as CMP. Example gate materials include, for instance, tungsten (W), titanium (Ti), titanium nitride (TiN), aluminum (Al), cobalt (Co), tantalum (Ta), and tantalum nitride (TaN), to name a few examples. In some example cases, gate material structure 514 has a thickness in the range of, for instance, 1 nm to 20 nm. In some example embodiments, gate material structure 514 includes multiple materials, such as plug material (e.g., tungsten), work function material (e.g., tantalum nitride), and resistance reducing materials (e.g., titanium).

With further reference to FIG. 4A, process 400 continues at 408 with patterning one or more gate electrodes. A drive or so-called select signal can be applied to the gate electrode of a thin film transistor structure to turn that transistor 'ON' (or 'OFF'). FIG. 5D illustrates an example resulting structure after this patterning, in accordance with an embodiment. As can be seen in this example case, two gate electrodes 516A and 516B are patterned on ILD structure 512. Gate electrodes 516A and 516B can be provisioned on ILD structure 512 using any number of suitable processes. For instance, in some embodiments, a hardmask can be provisioned using standard photolithography, including deposition of or more hardmask materials (e.g., such as silicon dioxide, silicon nitride, and/or other suitable hardmask materials), patterning resist on a portion of the hardmask that will remain temporarily to protect an underlying region of gate material structure 514, etching to remove the unmasked (no resist) portions of the hardmask (e.g., using a dry etch, or other suitable hardmask removal process), and then stripping the patterned resist material, thereby leaving the patterned gate electrodes 516A and 516B. Any number of suitable mask configurations can be used, as will be apparent. Note that gate electrodes 516A and 516B are each shown as having the same dimensions (e.g., width and depth/height) in this example structure for ease of illustration; however, the present disclosure is not intended to be so limited. Further note that although two gate electrodes 516A and 516B are shown in the example structure, any number of gate components may be formed, such as one, two, ten, hundreds, thousands, millions, etc., depending on the end use or target application.

With further reference to FIG. 4A, process 400 continues at 410 with performing a second deposition of the ILD material and polish back. FIG. 5E illustrates an example resulting structure after the second deposition of the ILD material and polish back, according to an embodiment. As can be seen, the second deposition of the ILD material effectively completes ILD layer or structure 512, by depositing additional ILD material on the sides of and above the gate components. The second deposition of the ILD material for ILD structure 512 may include any suitable deposition processes, such as CVD, ALD, PVD, or any other suitable BEOL deposition processes. In some embodiments, the deposited ILD material may be polished back or planarized to remove any topography resulting from the second deposition of the ILD material. Example ILD materials include, for instance, any of the materials suitable for use in the first deposition 404 previously described (e.g., silicon dioxide). As will be appreciated, if the same ILD material is used at 404 and 410, there will be no discernible seam or interface line between the first and second depositions. On the other hand, if compositionally distinct materials are used, then the first and second depositions of 404 and 410, respectively, will be distinguishable from one another (using material analysis or SEM imaging). As will be further appreciated, the thickness of the resulting ILD structure 512 can vary greatly, and the claimed invention is not intended to be limited to any particular range of thicknesses.

With further reference to FIG. 4A, process 400 continues at 412 with etching one or more selectable via trenches. FIG. 5F illustrates an example resulting structure wherein two selectable via trenches 518A and 518B are etched, in accordance with an embodiment. As can be seen, trenches 518A and 518B are etched into ILD structure 512, respective gate electrodes 516A and 516B, and etch stop 506 down to the metal of respective $M_n$ metal lines in $n^{th}$ metal layer 504. Each trench allows for formation of a BEOL selectable via (e.g., a selectable $V_n$ via) that can be selected to allow for a conductive interconnect between the corresponding $M_n$ metal line in layer 504 and some line or other conductive feature within or above layer 512. Trenches 518A and 518B can be etched using standard photolithography including subsequent etch processes followed by polish and cleans, according to some such embodiments. The geometry of the trenches (width, depth, length, and shape) can vary from one embodiment to the next as will be appreciated, and the present disclosure is not intended to be limited to any particular trench geometry. In one specific example embodiment, a dry etch is used to form trenches 518A and 518B. The dry etch process provides directional control, which allows for formation of well-defined trenches, although other embodiments may employ a wet etch or a combination of wet and dry etches, depending on the desired level of etch precision and/or the shape of the feature being formed.

With further reference to FIG. 4A, process 400 continues at 414 with depositing a gate dielectric material (or materials, as the case may be). FIG. 5G illustrates an example resulting structure after the deposition of the gate dielectric material(s) to form a gate dielectric 520, according to an embodiment. As can be seen, gate dielectric 520 may be conformally deposited onto the bottom and sidewalls of trenches 518A and 518B, as well as on the top surface of ILD structure 512 outside trenches 518A and 518B. The conformal deposition of the gate dielectric material for gate dielectric 520 may include ALD, or any suitable deposition processes, such as CVD, PVD, or any other suitable conformal deposition processes. In some embodiments, the gate dielectric material is silicon dioxide and/or a high-k dielectric material. Examples of high-k gate dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on gate dielectric 520 to improve its quality when a high-k material is used. In some example cases, gate dielectric 520 has a thickness in the range of, for instance, 0.5 angstroms to 5 nm (such as 1 to 2 nm). As will be appreciated in the light of this disclosure, the thickness of gate dielectric 520 can vary greatly depending on the end use or target application, and the claimed invention is not intended to be limited to any particular range of thicknesses.

In some embodiments, gate dielectric 520 and/or gate electrodes 516A/516B may include a multilayer structure of two or more material layers or components. For instance, in one such embodiment, gate dielectric 520 is a bi-layer structure having a first dielectric material in contact with gate electrodes 516A/516B and a second dielectric material in contact with the first dielectric material, the first dielectric material having a dielectric constant that is higher than the dielectric constant of the second dielectric material (or vice-versa). Likewise, gate electrodes 516A/516B may include, for instance, a tungsten portion with one or more work function and/or barrier portions (e.g., tantalum, tantalum nitride), and/or a resistance reducing portion (e.g., copper, gold). In some embodiments, gate dielectric 520 and/or gate electrodes 516A/516B may include grading (increasing or decreasing, as the case may be) of the concentration of one or more materials therein.

With reference to FIG. 4B, process 400 continues at 416 with conformally depositing a transition metal dichalcogenide (TMD) precursor. The TMD precursor may be conformally deposited onto gate dielectric 520 (for instance, onto gate dielectric 520 on the bottom and sidewalls of trenches 518A and 518B, as well as onto gate dielectric 520 outside trenches 518A and 518B. A directional etch can then be performed to etch away the TMD precursor from the horizontal surfaces and leaving intact the TMD precursor on the vertical surfaces (e.g., on gate dielectric 520 on the sidewalls of trenches 518A and 518B). FIG. 5H illustrates an example resulting structure after deposition and directional etch of the TMD precursor material to form a TMD precursor structure 522, according to an embodiment. As can be seen, TMD precursor structure 522 may be formed on gate dielectric 520 on the sidewalls of trenches 518A and 518B. In other embodiments, the TMD precursor may be selectively deposited. For example, gate dielectric 520 on the sidewalls of trenches 518A and 518B can be pre-treated so that TMD precursor structure 522 selectively grows only on gate dielectric 520 on the sidewalls of trenches 518A and 518B. Example TMD precursor materials include, for instance, transition metals such as titanium (Ti), zirconium (Zr), silver (Ag), iron (Fe), zinc (Zn), osmium (Os), vanadium (V), manganese (Mn), gold (Au), cadmium (Cd), mercury (Hg), niobium (Nb), technetium (Tc), tantalum (Ta), hafnium (Hf), cobalt (Co), ruthenium (Ru), chromium (Cr), copper (Cu), palladium (Pd), rhodium (Rh), nickel (Ni), molybdenum (Mo), tungsten (W), iridium (Ir), rhenium (Re), and platinum (Pt), to name a few examples. In some example cases, TMD precursor structure 522 has a thickness in the range of, for instance, 1 nm to 10 nm. As will be appreciated in the light of this disclosure, the thickness of TMD precursor structure 522 can vary greatly depending on the end use or target application, and the claimed invention is not intended to be limited to any particular range of thicknesses.

With further reference to FIG. 4B, process 400 continues at 418 with forming the TMD. In some embodiments, the deposited TMD precursor material is transformed or otherwise converted to the TMD. TMD precursor structure 522 can be converted to form a TMD, for instance, by exposing TMD precursor structure 522 to a chalcogenide source, such as a chalcogen gas, under the appropriate growth conditions (e.g., heat, pressure) to transform TMD precursor structure 522 to a TMD. FIG. 5I illustrates an example resulting structure after TMD precursor structure 522 is transformed into a TMD structure 524, according to an embodiment. TMD structure 524 forms the active semiconductor channel structure or so-called channel region of the BEOL thin film transistor structure. In some example cases, TMD structure 524 has a thickness of, for instance, one monolayer to several monolayers. In other example cases, TMD structure 524 has a thickness up to 10 nm, including up to 8 nm, up to 5 nm, up to 4, nm, up to 3 nm, up to 2 nm, or up to 1 nm. Some such TMD materials have a monolayer thickness less than 1 nm. In some such cases, TMD structure 524 has a thickness in the range of, for instance, 0.3 nm to 10 nm. As will be appreciated in the light of this disclosure, the thickness of TMD structure 524 can vary greatly depending on the end use or target application, and the claimed invention is not intended to be limited to any particular range of thicknesses.

In other embodiments, rather than deposition 416 of a TMD precursor and transformation 418 to TMD, a suitable thin film transistor semiconductor material can be selectively deposited on gate dielectric 520 on the sidewalls of trenches 518A and 518B, as will be appreciated. In some such embodiments, the deposited thin film transistor semiconductor material forms the active semiconductor channel structure or so-called channel region of the BEOL thin film transistor structure.

With further reference to FIG. 4B, process 400 continues at 420 with selectively etching the gate dielectric structure. FIG. 5J illustrates an example resulting structure after selectively etching gate dielectric 520, according to an embodiment. As can be seen, the etching of gate dielectric 520 is selective to the horizontal surfaces (e.g., the bottom surfaces of trenches 518A and 518B and the top surface of ILD structure 512 outside trenches 518A and 518B) or regions, and gate dielectric 520 on the sidewalls of trenches 518A and 518B remains intact. Gate dielectric 520 remaining after the selective etch is between the sidewalls of the respective gates 516A and 516B and TMD structures 524, as well as between ILD structure 512 and TMD structures 524. The selective etching of gate dielectric 520 from the horizontal surfaces opens up the bottom of trenches 518A and 518B for subsequent formation of contacts for a source/drain region of the BEOL thin film transistor structure. In one specific example embodiment, an anisotropic dry etch is used to selectively etch gate dielectric 520 from the horizontal surfaces.

With further reference to FIG. 4B, process 400 continues at 422 with performing bottom contact material deposition and etch back. FIG. 5K illustrates an example resulting structure after the deposition of the bottom contact material and etch back to form bottom contact structures 526 on the lower source/drain regions or portions of TMD structures 524, according to an embodiment. As can be seen, bottom contact structure 526 extends through etch stop 506 to couple TMD structure 524 to a metal line $M_n$ (e.g., an interconnect) in $n^{th}$ metal layer 504. The deposition of bottom contact structure 526 may include any suitable deposition processes, such as CVD, ALD, PVD, or any other suitable BEOL deposition processes. Any excess deposited bottom contact material may be selectively etched back to achieve a desired vertical thickness of bottom contact structure 526. Example contact materials include copper (Cu), tungsten (W), titanium oxynitride (e.g., $TiO_xN_y$ with x>0 and y>0), titanium (Ti), tantalum (Ta), tantalum nitride (e.g., TaN), aluminum titanium nitride (e.g., $AlTi_xN_y$ with 0<x<1 and y>0), indium titanium oxide (ITO), indium oxide (InO), indium zinc oxide (IZO), and reduced indium gallium zinc oxide (IGZO), to name a few examples. In some example cases, bottom contact structure 526 has a vertical thickness in the range of, for instance, 5 nm to 50 nm, and a horizontal thickness up to the size of the via. As will be appreciated in the light of this disclosure, the vertical thickness of the resulting bottom contact structure 526 determines the size of the contact or interface area between structures 524 and 526.

In some embodiments, bottom contact structure 526 may be selectively deposited onto the bottom of trenches 518A and 518B. For example, the metal of the metal lines Mn exposed at the bottom of trenches 518A and 518B can be pre-treated so that bottom contact structure 526 dominantly or otherwise selectively grows only on the pre-treated metal at the bottom of trenches 518A and 518B. In other embodiments, bottom contact structure 526 may be a metal, such as a copper interconnect, formed by a damascene process. In any such cases, excess contact material can be etched away (e.g., such as any contact material that forms on the upper surface of structure 512.

With further reference to FIG. 4B, process 400 continues at 424 with performing ILD material deposition and etch back. FIG. 5L illustrates an example resulting structure after the deposition of the gate ILD material and etch back to form ILD structures 528, according to an embodiment. As can be seen, ILD structure 528 is formed above and on bottom contact structure 526 in respective trenches 518A and 518B. ILD structure 528 serves to isolate the source and drain contacts of the thin film transistor. The deposition of the ILD material for ILD structure 528 may include any suitable deposition processes, such as CVD, ALD, PVD, or any other suitable BEOL deposition processes. Any excess deposited ILD material may be etched to achieve a desired thickness of ILD structure 528. Example ILD materials include, for instance, silicon dioxide ($SiO_2$), SiOCN, and SiN, to name a few examples. In some example cases, ILD structure 528 has a thickness in the range of, for instance, 5 nm to 50 nm. As will be appreciated in the light of this disclosure, the thickness of the resulting ILD structure 528 can vary greatly depending on the desired distance between the source and drain contact structures, and the claimed invention is not intended to be limited to any particular range of thicknesses.

With further reference to FIG. 4B, process 400 continues at 426 with performing top contact material deposition and etch back. FIG. 5M illustrates an example resulting structure after the deposition of the top contact material and etch back to form top contact structures 530 on the upper source/drain regions or portions of TMD structures 524, according to an embodiment. The deposition of top contact structure 530 may include any suitable deposition processes, such as CVD, ALD, PVD, or any other suitable BEOL deposition processes. Any excess deposited top contact material may be etched or planarized (e.g., by way of CMP) to make the top surface of top contact structure 530 co-planar (or substantially co-planar) with the top surface of ILD structure 512. Example contact materials include, for instance, any of the contact materials suitable for use in bottom contact structure 526 previously described. The previous discussion with respect to contact structure vertical and horizontal thickness equally apply here, but note in some embodiments that the upper contact structure 530 can be geometrically different than lower contact structure 526, whether due to unintentional process limitations (e.g., because the trenches 518A and 518B taper inward from bottom top) or intentional processing (e.g., where the drain contact structure is larger than the source contact structure).

As can be further seen in FIG. 5M, the BEOL thin film transistor structures each include a lower source/drain region, a bottom contact structure 526 that connects the lower source/drain region, a vertical channel structure adjacent the lower source/drain region, a gate structure that is on multiple sides of or completely surrounds the vertical channel structure of the thin film transistor (as indicated by gate electrode 516), an upper source/drain region, and a top contact structure 530 that connects the upper source/drain region adjacent the vertical channel structure. Given their position relative to one another, the BEOL thin film transistor structure is a vertically-oriented transistor device having a vertical channel architecture.

Note that bottom contact structure 526 and top contact structure 530 are both described herein as being for a source/drain region for ease of description, as either of bottom contact structure 526 or top contact structure 530 may be to the source region thereby making the other of bottom contact structure 526 or top contact structure 530 to the drain region. In other words, in some embodiments, the bottom portion of the BEOL thin film transistor structure is the source region and thus corresponding bottom contact structure 526 would be the source contact structure, making the top portion of the BEOL thin film transistor structure the drain region and thus corresponding top contact structure 530 would be the drain contact structure, while in other embodiments, the opposite configuration applies, with the drain region at the bottom and the source region at the top.

With further reference to FIG. 4B, process 400 continues at 428 with performing etch stop material deposition and next layer ILD material deposition. The etch stop material forms an etch stop 532 above ILD structure 512 and top contact structures 530, and the ILD material forms a next layer ILD structure 534 above etch stop 532. FIG. 5N shows an example resulting structure after formation of etch stop 532 and next layer ILD structure 534, according to an embodiment. Etch stop 532 is similar to etch stop 506 in that etch stop 532 and that previous relevant discussion equally applies here.

Next layer ILD structure 534 provides the insulating layer for the next layer of the interconnect structure. The deposition of the ILD material for next layer ILD structure 534 may include any suitable deposition processes, such as CVD, ALD, PVD, or any other suitable BEOL deposition processes. In some embodiments, the deposited ILD material may be polished back to remove any topography resulting from the second deposition of the ILD material. Example ILD materials include, for instance, any of the materials suitable for use in the first deposition 404 previously described. As will be appreciated in the light of this disclosure, the thickness of the resulting next layer ILD structure 534 can vary greatly, and the claimed invention is not intended to be limited to any particular range of thicknesses.

With further reference to FIG. 4B, process 400 continues at 430 with continued processing of the next layer of the interconnect structure. Such continued processing can include the patterning and formation of one or more interconnects in layers 534 and 532. FIG. 5O shows an example resulting structure after the formation of such interconnects, according to an embodiment. As can be seen, interconnect 536*a* is a global interconnect in that it connects to the two BEOL selectable vias formed through respective gates 516A and 516B. Interconnect 536*b* is a standard interconnect in that it connects to a standard $V_n$ via. Interconnects 536*c* and 536*d* connect to respective gate electrodes 516A and 516B. In such example embodiments, interconnect 536*c* can provide a drive or so-called select signal to cause gate electrode 516A to select (or de-select) its associated BEOL selectable via by turning 'ON' (or 'OFF') the BEOL thin film transistor structure. Similarly, interconnect 536*d* can provide a drive or so-called select signal to cause gate electrode 516B to select (or de-select) its associated BEOL selectable via by turning 'ON' (or 'OFF') the BEOL thin film transistor structure. As will be appreciated in light of this disclosure, note that an interconnect (e.g., metal line) need not connect to the top surface of the gate structure, but may connect to other surfaces of the gate structure. For instance, a vertically-going interconnect can connect to a bottom surface of the gate structure from a lower layer, or a laterally-going interconnect structure can connect to a side surface of the gate structure.

As further seen at the bottom of FIG. 5O, two top down cross-section views are provided, so as to show further details of the thin film transistor structure, according to some embodiments. The cross-section A-A shows the top down cross-section taken through top contact structure 530. Note that gate dielectric 520 wraps around the portions of the thin film transistor structure, such as TMD structure 524 in the illustrated example, that are outside the thin film transistor channel region. The cross-section B-B shows the top down cross-section taken through gate electrode 516A and the thin film transistor channel region. Here, note that gate dielectric 520 wraps around the portions of the channel region portion of the thin film transistor structure, such as TMD structure 524 in the illustrated example, and gate electrode 516A wraps around that portion of gate dielectric 520.

Note that the illustrated operations of process 400 are shown in a particular order for ease of description, in accordance with some embodiments. However, one or more of the operations of process 400 can be performed in a different order or need not be performed at all, in other embodiments. Numerous variations on process 400 and the techniques described herein will be apparent in light of this disclosure.

Example System

Figure 6:
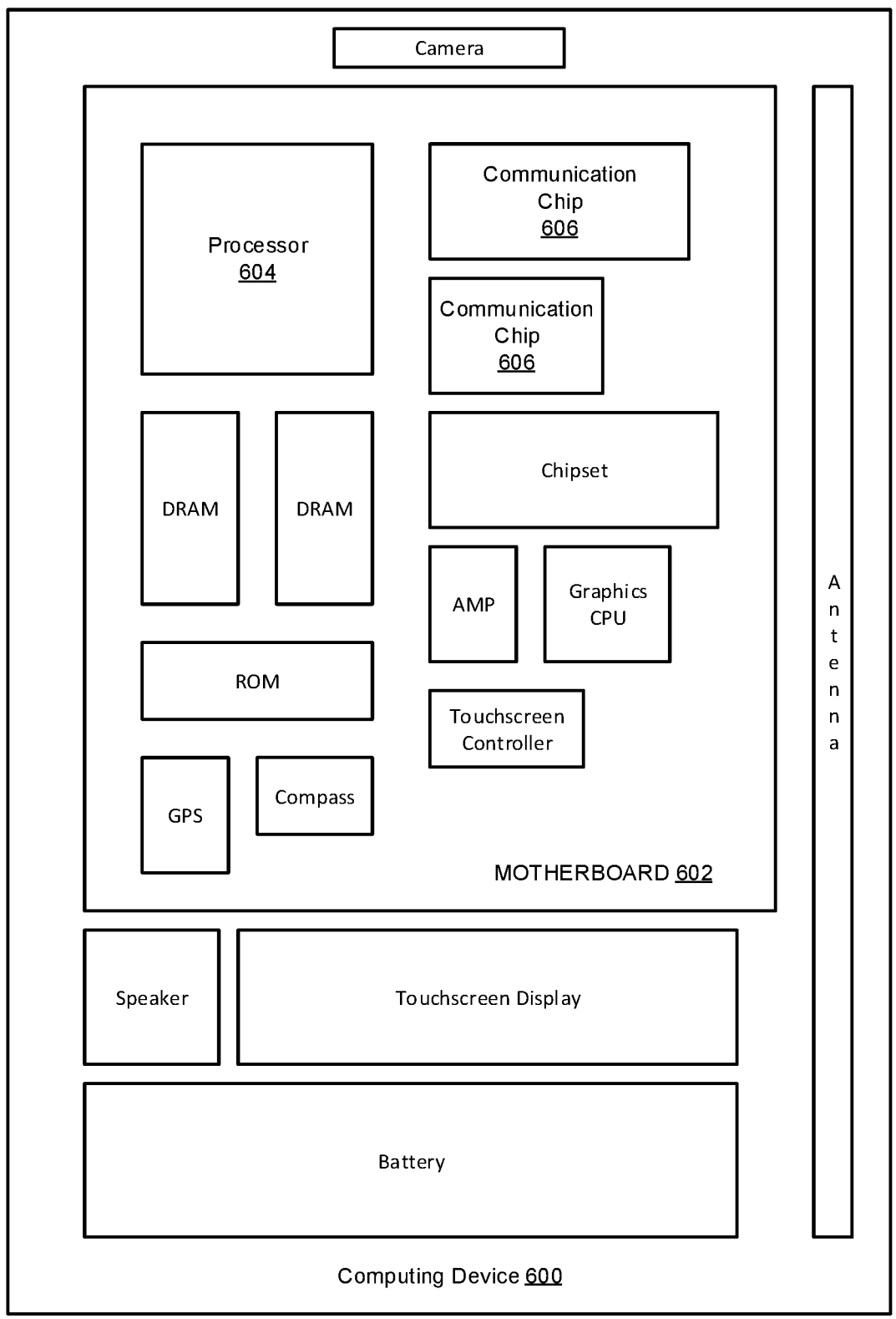
FIG. 6 is an example computing system implemented with one or more of the integrated circuit structures as disclosed herein, in accordance with an embodiment of the present disclosure.

FIG. 6 is an example computing system 600 implemented with one or more of the integrated circuit structures as disclosed herein, in accordance with an embodiment of the present disclosure. As can be seen, computing system 600 houses a motherboard 602. Motherboard 602 may include a number of components, including, but not limited to, a processor 604 and at least one communication chip 606, each of which can be physically and electrically coupled to motherboard 602, or otherwise integrated therein. As will be appreciated, motherboard 602 may be, for example, any printed circuit board, whether a main board, a daughterboard mounted on a main board, or the only board of system 600, etc.

Depending on its applications, computing system 600 may include one or more other components that may or may not be physically and electrically coupled to motherboard 602. These other components may include, but are not limited to, volatile memory (e.g., DRAM), non-volatile memory (e.g., read only memory (ROM)), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 600 may include one or more integrated circuit structures or devices configured in accordance with the disclosed techniques in accordance with an example embodiment (e.g., to include one or more semiconductor structures including selectable via structures, as variously provided herein). In some embodiments, multiple functions can be integrated into one or more chips (e.g., for instance, note that communication chip 606 can be part of or otherwise integrated into processor 604).

Communication chip 606 enables wireless communications for the transfer of data to and from computing system 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chip 606 may implement any of a number of wireless standards or protocols, including, but not limited to, Wi-Fi (Institute of Electrical and Electronics Engineers (IEEE) 802.11 family), worldwide interoperability for microwave access (WiMAX) (IEEE 802.16 family), IEEE 802.20, long term evolution (LTE), 1× evolution-data optimized (Ev-DO), high speed packet access (HSPA+), high speed downlink packet access (HSDPA+), high speed uplink packet access (HSUPA+), enhanced data rates for GSM evolution (EDGE), global system for mobile communication (GSM), general packet radio service (GPRS), code division multiple access (CDMA), time division multiple access (TDMA), digital enhanced cordless telecommunications (DECT), Bluetooth, derivatives thereof, as well as any other wireless protocols that are designated as 3G, 4G, 5G, and beyond. Computing system 600 may include multiple communication chips 606. For instance, a first communication chip 606 may be dedicated to shorter range wireless communications such as Wi-Fi and Bluetooth, and a second communication chip 606 may be dedicated to longer range wireless communications such as GPS, EDGE, GPRS, CDMA, WiMAX, LTE, Ev-DO, and others. In some embodiments, communication chip 606 may include one or more semiconductor structures including selectable vias as variously described herein.

Processor 604 of computing system 600 includes an integrated circuit die packaged within processor 604. In some embodiments, the integrated circuit die of the processor includes onboard circuitry that is implemented with one or more integrated circuit structures or devices formed using the disclosed techniques, as variously described herein. The term "processor" may refer to any device or portion of a device that processes, for instance, electronic data from registers and/or memory to transform that electronic data into other electronic data that may be stored in registers and/or memory.

Communication chip 606 also may include an integrated circuit die packaged within communication chip 606. In accordance with some such example embodiments, the integrated circuit die of the communication chip includes one or more integrated circuit structures or devices formed using the disclosed techniques, as variously described herein. As will be appreciated in light of this disclosure, note that multi-standard wireless capability may be integrated directly into processor 604 (e.g., where functionality of any chips 606 is integrated into processor 604, rather than having separate communication chips). Further note that processor 604 may be a chipset having such wireless capability. In short, any number of processors 604 and/or communication chips 606 can be used. Likewise, any one chip or chipset can have multiple functions integrated therein.

In various implementations, computing system 600 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device that processes data or employs one or more integrated circuit structures or devices formed using the disclosed techniques, as variously described herein.

FURTHER EXAMPLE EMBODIMENTS

The following examples pertain to further embodiments, from which numerous permutations and configurations will be apparent.

Example 1 includes an integrated circuit structure including: a first interconnect feature; a second interconnect feature; a third interconnect feature; a first selectable via comprising a first thin film transistor (TFT) structure, the first TFT structure including a first gate electrode, a first source contact, and a first drain contact, wherein one of the first source contact or the first drain contact is connected to the first interconnect feature, and the other one of the first source contact or the first drain contact is connected to the third interconnect feature, and the first gate electrode is configured to receive a first select signal that causes the first interconnect feature to be electrically connected to the third interconnect feature; and a second selectable via comprising a second thin film transistor (TFT) structure, the second TFT structure including a second gate electrode, a second source contact, and a second drain contact, wherein one of the second source contact or the second drain contact is connected to the second interconnect feature, and the other one of the second source contact or the second drain contact is connected to the third interconnect feature, and the second gate electrode is configured to receive a second select signal that causes the second interconnect feature to be electrically connected to the third interconnect feature.

Example 2 includes the subject matter of Example 1, wherein the first source contact and the first drain contact are oriented in a first vertical configuration, and the second source contact and the second drain contact are oriented in a second vertical configuration.

Example 3 includes the subject matter of Examples 1 or 2, wherein the first and second interconnect features are part of a local interconnect structure, and the integrated circuit structure further comprises a device layer adjacent the local interconnect, the device layer including first and second non-planar transistors, the first and second interconnect features each connected to the one or both of the first and second non-planar transistors.

Example 4 includes the subject matter of Example 3, wherein the third interconnect feature is included in an interconnect layer above the device layer and the local interconnect structure.

Example 5 includes the subject matter of any of Examples 1 through 4, wherein one or both of the first and second TFT structures comprises a transition metal dichalcogenide (TMD) material.

Example 6 includes the subject matter of any of Examples 1 through 5, wherein the first TFT structure further comprises a first gate dielectric, the first gate dielectric disposed between the first gate electrode and a first channel structure, and the second TFT structure further comprises a second gate dielectric, the second gate dielectric disposed between the second gate electrode and a second channel structure, and wherein the first gate dielectric wraps around the first channel structure and the first gate electrode wraps around the first gate dielectric, and the second gate dielectric wraps around the second channel structure and the second gate electrode wraps around the second gate dielectric.

Example 7 includes the subject matter of any of Examples 1 through 6, wherein the first selectable via and the second selectable via are part of an X:1 multiplexer (MUX) comprised of a plurality of selectable vias, wherein the first and second interconnect features are inputs of the X:1 MUX and the third interconnect feature is an output of the X:1 MUX.

Example 8 includes the subject matter of any of Examples 1 through 7, wherein the first selectable via and the second selectable via are part of an X:Z MUX comprised of a plurality of selectable vias, wherein the first and second interconnect features are inputs of the X:Z MUX and the third interconnect feature is an output of the X:Z MUX.

Example 9 is a back end interconnect structure including the integrated circuit structure of any of Examples 1 through 8.

Example 10 is a processor including the integrated circuit structure of any of Examples 1 through 8.

Example 11 is a communication chip including the integrated circuit structure of any of Examples 1 through 8.

Example 12 is a system-on-chip including the integrated circuit structure of any of Examples 1 through 8.

Example 13 is a mobile computing device including the integrated circuit structure of any of Examples 1 through 8.

Example 14 includes an integrated circuit structure including: a first layer comprising a plurality of interconnects within insulator material, the plurality of interconnects including at least a first interconnect and a second interconnect; a second layer above the first layer, the second layer including a plurality of selectable vias including at least a first selectable via and a second selectable via, the first selectable via comprising a first thin film transistor (TFT) structure, the second selectable via comprising a second TFT structure, wherein the first selectable via is connected to the first interconnect, and the second selectable via is connected to the second interconnect; and a third layer above the second layer, the third layer comprising a global interconnect, wherein the global interconnect is connected to both the first selectable via and the second selectable via.

Example 15 includes the subject matter of Example 14, wherein source and drain contacts for each of the first and second TFT transistor structures are oriented in a vertical configuration.

Example 16 includes the subject matter of Examples 14 or 15, wherein the first and second interconnects are part of a local interconnect structure, and the integrated circuit structure further comprises a device layer adjacent the local interconnect, the device layer including first and second non-planar transistors, the first and second interconnects each connected to the one or both of the first and second non-planar transistors.

Example 17 includes the subject matter of Example 16, wherein the global interconnect is further connected to one or more of an additional interconnect structure, an electrical component, a power source, or a signal source.

Example 18 includes the subject matter of any of Examples 14 through 17, wherein one or both of the first and second TFT structures comprises a transition metal dichalcogenide (TMD) material.

Example 19 includes the subject matter of Example 18, wherein the first TFT structure further comprises a first high-k gate dielectric and a first gate electrode, the first high-k gate dielectric disposed between the first gate electrode and the TMD material, and wherein the second TFT structure further comprises a second high-k gate dielectric and a second gate electrode, the second high-k gate dielectric disposed between the second gate electrode and the TMD material.

Example 20 includes the subject matter of any of Examples 14 through 19, wherein the first TFT structure comprises a first channel structure, a first gate dielectric, and a first gate electrode, the first gate dielectric wrapped around the first channel structure, and the first gate electrode wrapped around the first gate dielectric, and wherein the second TFT structure comprises a second channel structure, a second gate dielectric, and a second gate electrode, the second gate dielectric wrapped around the second channel structure, and the second gate electrode wrapped around the second gate dielectric.

Example 21 includes the subject matter of any of Examples 14 through 20, wherein the first selectable via and the second selectable via are part of an X:1 multiplexer (MUX) comprised of a plurality of selectable vias, wherein the first and second interconnects are inputs of the X:1 MUX and the third interconnect is an output of the X:1 MUX.

Example 22 includes the subject matter of any of Examples 14 through 21, wherein the first selectable via and the second selectable via are part of an X:Z MUX comprised of a plurality of selectable vias, wherein the first and second interconnects are inputs of the X:Z MUX and the third interconnect is an output of the X:Z MUX.

Example 23 is a back end interconnect structure including the integrated circuit structure of any of Examples 14 through 22.

Example 24 is a communication chip including the integrated circuit structure of any of Examples 14 through 22.

Example 25 is a processor including the integrated circuit structure of any of Examples 14 through 22.

Example 26 is a system-on-chip including the integrated circuit structure of any of Examples 14 through 22.

Example 27 is a mobile computing device including the integrated circuit structure of any of Examples 14 through 22.

Example 28 is a method for forming an integrated circuit structure. The method includes: forming a first layer comprising an insulator material having a first interconnect and a second interconnect therein; performing a first deposition of insulator material to partially form a second layer above the first layer; forming a gate electrode above the partially formed second layer and aligned with the first interconnect; performing a second deposition of the insulator material to complete the second layer and encase the gate electrode; forming a via that passes into the second layer and through the gate electrode; forming a thin film transistor (TFT) structure in the via, wherein the gate electrode wraps around a channel structure of the TFT structure; and forming a third layer over the second layer and comprising the insulator material having a third interconnect therein; wherein one of a source contact or a drain contact of the TFT structure is connected to the first interconnect, and the other one of the source contact or the drain contact of the TFT structure is connected to the third interconnect.

Example 29 includes the subject matter of Example 28, wherein forming the TFT structure includes: forming a gate dielectric structure on a bottom and sidewalls of the via; forming a transition metal dichalcogenide (TMD) structure on the gate dielectric structure on the sidewalls of the via; removing the portion of the gate dielectric structure on the bottom of the via; and forming a bottom contact structure on the bottom of the via, a ILD structure on the bottom contact structure, and a top contact structure on the ILD structure, all in the via.

Example 30 includes the subject matter of Example 29, wherein forming the TMD structure includes transforming a TMD precursor into the TMD structure.

Example 31 includes the subject matter of Example 29 or 30, wherein the gate dielectric structure includes a high-k dielectric.

Example 32 includes the subject matter of any of Examples 28 through 31, wherein the gate electrode is a first gate electrode, the via is a first via, and the TFT structure is a first TFT structure, the method further including: forming a second gate electrode above the partially formed second layer and aligned with the second interconnect; forming a second via that passes into the second layer and through the second gate electrode; and forming a second TFT structure in the second via, wherein the second gate electrode wraps around a second channel structure of the second TFT structure; wherein one of a source contact or a drain contact of the second TFT structure is connected to the second interconnect, and the other one of the source contact or the drain contact of the second TFT structure is connected to the third interconnect.

Example 33 includes the subject matter of any of Examples 28 through 32, wherein the TFT structure has a vertically-oriented configuration.

Example 34 includes an integrated circuit structure including: a first interconnect feature; a second interconnect feature; a via structure comprising a vertically-oriented thin film transistor (TFT) structure, the TFT structure including a gate dielectric wrapped around a channel structure, a gate electrode wrapped around the gate dielectric, a source contact, and a drain contact, wherein one of the source contact or the drain contact is connected to the first interconnect feature, and the other one of the source contact or the drain contact is connected to the third interconnect, and the gate electrode is configured to receive a select signal that causes the first interconnect feature to be electrically connected to the second interconnect feature.

Example 35 includes the subject matter of Example 34, wherein the via structure is a first via structure, the integrated circuit structure further comprising a second via structure that connects a third interconnect feature to the second interconnect feature.

Example 36 includes the subject matter of Examples 34 or 35, wherein the TFT structure is a first TFT structure, and the second via structure includes a second vertically-oriented thin TFT structure, the second TFT structure including a second gate dielectric wrapped around a second channel structure, a second gate electrode wrapped around the second gate dielectric, a second source contact, and a second drain contact, wherein one of the second source contact or the second drain contact is connected to the third interconnect feature, and the other one of the second source contact or the second drain contact is connected to the third interconnect, and the second gate electrode is configured to receive a second select signal that causes the third interconnect feature to be electrically connected to the second interconnect feature.

Terms used in the present disclosure and in the appended claims (e.g., bodies of the appended claims) are generally intended as "open" terms (e.g., the term "including" should be interpreted as "including, but not limited to," the term "having" should be interpreted as "having at least," the term "includes" should be interpreted as "includes, but is not limited to," etc.).

All examples and conditional language recited in the present disclosure are intended for pedagogical examples to aid the reader in understanding the present disclosure, and are to be construed as being without limitation to such specifically recited examples and conditions. Although example embodiments of the present disclosure have been described in detail, various changes, substitutions, and alterations could be made hereto without departing from the spirit and scope of the present disclosure. Accordingly, it is intended that the scope of the present disclosure be limited not by this detailed description, but rather by the claims appended hereto.

What is claimed is:

1. An integrated circuit structure, comprising:
   a plurality of first interconnect features;
   a plurality of second interconnect features;
   a third interconnect feature;
   a first plurality of selectable vias, each of the first plurality of selectable vias comprising a corresponding first thin film transistor (TFT) structure, the first TFT structure including a first gate electrode, a first source contact, and a first drain contact, wherein one of the first source contact or the first drain contact is connected to a corresponding one of the plurality of first interconnect features, and the other one of the first source contact or the first drain contact is connected to the third interconnect feature, and the first gate electrode is configured to receive a first select signal that causes the corresponding one of the plurality of first interconnect features to be electrically connected to the third interconnect feature; and
   a second plurality of selectable vias, each of the second plurality of selectable vias comprising a second thin film transistor (TFT) structure, the second TFT structure including a second gate electrode, a second source contact, and a second drain contact, wherein one of the second source contact or the second drain contact is connected to a corresponding one of the plurality of second interconnect features, and the other one of the second source contact or the second drain contact is connected to the third interconnect feature, and the second gate electrode is configured to receive a second select signal that causes the corresponding one of the plurality of second interconnect features to be electrically connected to the third interconnect feature, wherein the third interconnect feature vertically overlaps and extends between the other one of the second source contact or the second drain contact of each of the second TFT structures and the other one of the first source contact or the first drain contact of each of the first TFT structures, and wherein the third interconnect feature electrically couples the other one of the second source contact or the second drain contact of each of the second TFT structures and the other one of the first source contact or the first drain contact of each of the first TFT structures.

2. The integrated circuit structure of claim 1, wherein the first source contact and the first drain contact are oriented in a first vertical configuration, and the second source contact and the second drain contact are oriented in a second vertical configuration.

3. The integrated circuit structure of claim 1, wherein the first and second pluralities of interconnect features are part of a local interconnect structure, and the integrated circuit structure further comprises a device layer adjacent the local interconnect, the device layer including first and second non-planar transistors, the first and second interconnect features each connected to the one or both of the first and second non-planar transistors.

4. The integrated circuit structure of claim 3, wherein the third interconnect feature is included in an interconnect layer above the device layer and the local interconnect structure.

5. The integrated circuit structure of claim 1, wherein each of the first and second TFT structures comprises a transition metal dichalcogenide (TMD) material.

6. The integrated circuit structure of claim 1, wherein each of the first TFT structures further comprises a first gate dielectric, the first gate dielectric disposed between the first gate electrode and a first channel structure, and each of the second TFT structures further comprises a second gate dielectric, the second gate dielectric disposed between the second gate electrode and a second channel structure, and wherein the first gate dielectric wraps around the first channel structure and the first gate electrode wraps around the first gate dielectric, and the second gate dielectric wraps around the second channel structure and the second gate electrode wraps around the second gate dielectric.

7. An integrated circuit structure, comprising:
a first layer comprising a plurality of interconnects within insulator material, the plurality of interconnects including at least a first plurality of interconnects and a second plurality of interconnects;
a second layer above the first layer, the second layer including a first plurality of selectable vias and a second plurality of selectable vias, each selectable via of the first plurality of selectable vias including a first selectable via comprising a first thin film transistor (TFT) structure, and each selectable via of the second plurality of selectable vias comprising a second TFT structure, wherein each first selectable via is connected to a corresponding one of the first plurality of interconnects, and each second selectable via is connected to a corresponding one of the second plurality of interconnects; and
a third layer above the second layer, the third layer comprising a global interconnect, wherein the global interconnect vertically overlaps and extends between each of the first selectable vias and each of the second selectable vias, and wherein the global interconnect electrically couples each of the first selectable vias and each of the second selectable vias.

8. The integrated circuit structure of claim 7, wherein source and drain contacts for each of the first and second TFT transistor structures are oriented in a vertical configuration.

9. The integrated circuit structure of claim 7, wherein the first and second pluralities of interconnects are part of a local interconnect structure, and the integrated circuit structure further comprises a device layer adjacent the local interconnect, the device layer including first and second non-planar transistors, the first and second pluralities of interconnects each connected to the one or both of the first and second non-planar transistors.

10. The integrated circuit structure of claim 9, wherein the global interconnect is further connected to one or more of an additional interconnect structure, an electrical component, a power source, or a signal source.

11. The integrated circuit structure of claim 7, wherein each of the first and second TFT structures comprises a transition metal dichalcogenide (TMD) material.

12. The integrated circuit structure of claim 11, wherein each first TFT structure further comprises a first high-k gate dielectric and a first gate electrode, the first high-k gate dielectric disposed between the first gate electrode and the TMD material, and wherein each second TFT structure further comprises a second high-k gate dielectric and a second gate electrode, the second high-k gate dielectric disposed between the second gate electrode and the TMD material.

13. The integrated circuit structure of claim 7, wherein each first TFT structure comprises a first channel structure, a first gate dielectric, and a first gate electrode, the first gate dielectric wrapped around the first channel structure, and the first gate electrode wrapped around the first gate dielectric, and wherein each second TFT structure comprises a second channel structure, a second gate dielectric, and a second gate electrode, the second gate dielectric wrapped around the second channel structure, and the second gate electrode wrapped around the second gate dielectric.

* * * * *